(12) United States Patent
Ogura et al.

(10) Patent No.: US 9,059,236 B2
(45) Date of Patent: Jun. 16, 2015

(54) SEMICONDUCTOR DEVICE

(71) Applicant: KABUSHIKI KAISHA TOSHIBA, Minato-ku (JP)

(72) Inventors: Tsuneo Ogura, Kanagawa-ken (JP); Tomoko Matsudai, Tokyo (JP); Yuichi Oshino, Tokyo (JP); Shinichiro Misu, Tokyo (JP); Yoshiko Ikeda, Kanagawa-ken (JP); Kazutoshi Nakamura, Hyogo-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 41 days.

(21) Appl. No.: 14/013,741

(22) Filed: Aug. 29, 2013

(65) Prior Publication Data
US 2014/0124832 A1 May 8, 2014

(30) Foreign Application Priority Data

Nov. 6, 2012 (JP) ................. 2012-244778
May 24, 2013 (JP) ................. 2013-110390

(51) Int. Cl.
*H01L 29/66* (2006.01)
*H01L 29/861* (2006.01)
*H01L 29/739* (2006.01)
*H01L 29/868* (2006.01)
*H01L 29/08* (2006.01)
H01L 27/08 (2006.01)

(52) U.S. Cl.
CPC .......... *H01L 29/7391* (2013.01); *H01L 29/868* (2013.01); *H01L 27/0814* (2013.01); *H01L 29/861* (2013.01); *H01L 29/083* (2013.01)

(58) Field of Classification Search
CPC ... H01L 29/861; H01L 29/868; H01L 29/083; H01L 29/66333; H01L 29/66136; H01L 29/1095; H01L 29/7393; H01L 29/0615; H01L 29/6609; H01L 27/0814
See application file for complete search history.

(56) References Cited

U.S. PATENT DOCUMENTS 5,156,981 A * 10/1992 Kitagawa et al. ............. 438/133
5,389,815 A    2/1995 Takahashi
7,528,459 B2 *  5/2009 Ritter et al. .................. 257/471

FOREIGN PATENT DOCUMENTS

| JP | 07-037895 A | 2/1995 |
| JP | 09-082986 A | 3/1997 |
| JP | 09-121062 A | 5/1997 |
| JP | 10-093114 A | 4/1998 |
| JP | 2007-324428 A | 12/2007 |
| JP | 2009-087973 A | 4/2009 |
| JP | 2011-134998 A | 7/2011 |
| JP | 2012-033568 A | 2/2012 |

\* cited by examiner

*Primary Examiner* — Thanh V Pham
(74) *Attorney, Agent, or Firm* — White & Case LLP

(57) ABSTRACT

According to one embodiment, a semiconductor device includes: a first electrode; a second electrode; a first semiconductor layer provided between the first electrode and the second electrode; a second semiconductor layer provided between the first semiconductor layer and the second electrode, and the second semiconductor layer having a lower impurity concentration than the first semiconductor layer; a first semiconductor region provided between part of the second semiconductor layer and the second electrode; a second semiconductor region provided between a portion different from the part of the second semiconductor layer and the second electrode, and the second semiconductor region being in contact with the first semiconductor region; and a third semiconductor region provided between at least part of the first semiconductor region and the second electrode.

20 Claims, 21 Drawing Sheets

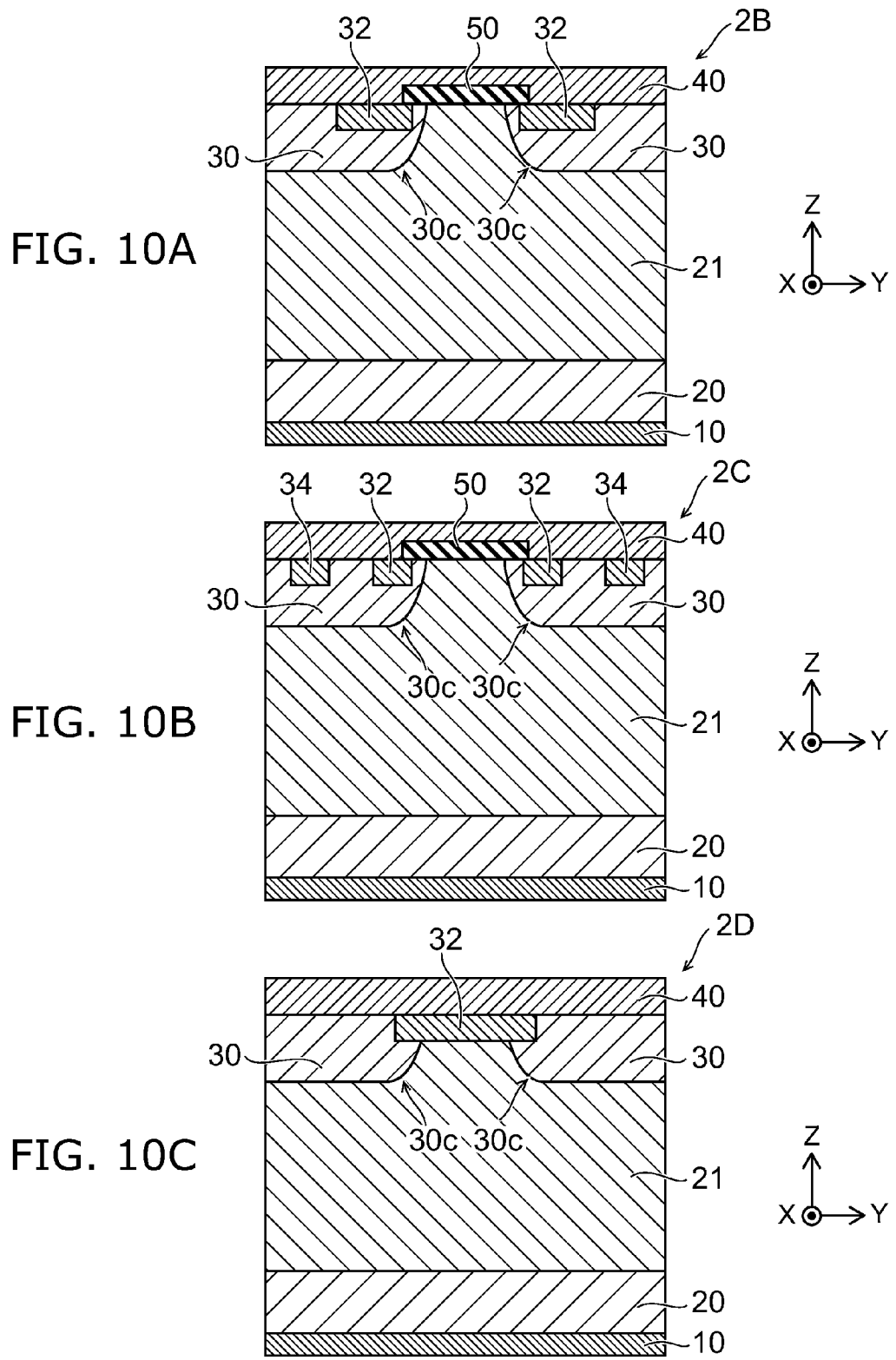

SEMICONDUCTOR DEVICE

CROSS-REFERENCE TO RELATED APPLICATIONS

This application is based upon and claims the benefit of priority from Japanese Patent Application No. 2012-244778, filed on Nov. 6, 2012; and Japanese Patent Application No. 2013-110390, filed on May 24, 2013; the entire contents of which are incorporated herein by reference.

FIELD

Embodiments described herein relate generally to a semiconductor device.

BACKGROUND

Recently, an IGBT (insulated gate bipolar transistor), a diode and the like are used as semiconductor elements used for a power conversion device such as an inverter. The diode is typically used as a back-flow diode and connected antiparallel to the IGBT. Thus, the diode is referred to as free wheeling diode (FWD).

For the characteristics improvement of a power conversion device such as an inverter, the characteristics improvement of the FWD is important along with the characteristics improvement of the IGBT. Important characteristics of the FWD include the on-voltage (voltage drop in the conducting state), switching time (extinction time of the recovery current at turn-off time), and safe operating area at turn-off time (area free from breakdown even under voltage application when the recovery current is flowing). Furthermore, for FWD, it is more desirable that the current/voltage oscillation at turn-off time be smaller. Among them, it is important to expand the safe operating area at turn-off time.

BRIEF DESCRIPTION OF THE DRAWINGS

FIGS. 10A to 10C are schematic sectional views of semiconductor devices according to variations of the second embodiment;

DETAILED DESCRIPTION

Figure 1A:
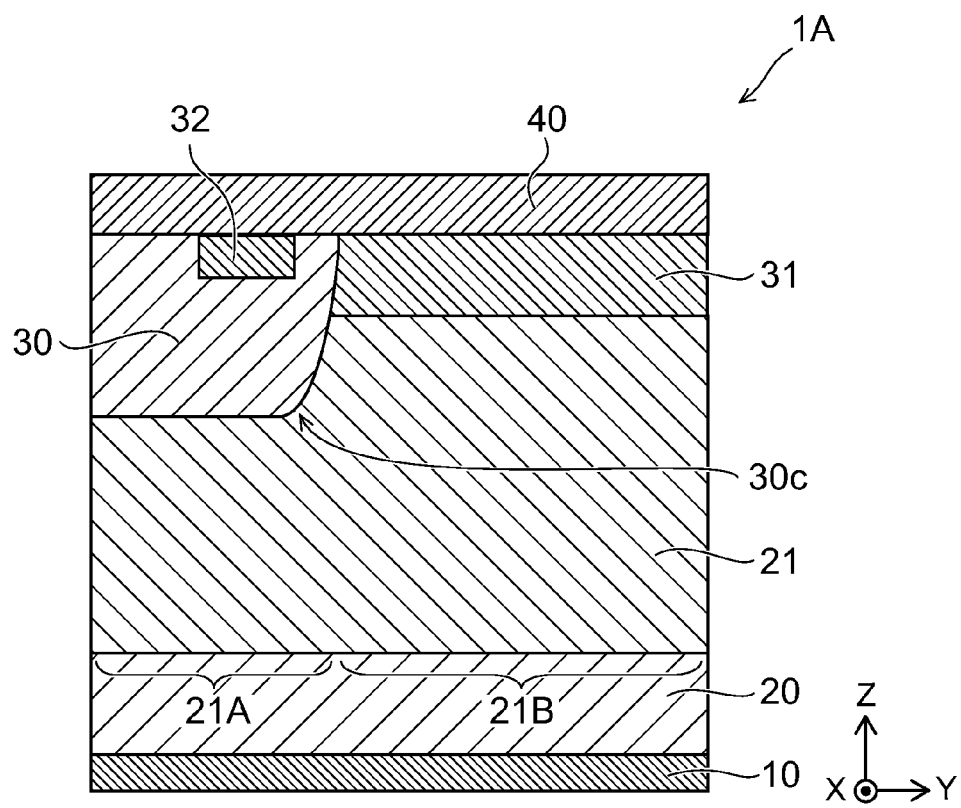
FIGS. 1A and 1B are schematic views of a semiconductor device according to a first embodiment.

In general, according to one embodiment, a semiconductor device includes: a first electrode; a second electrode; a first semiconductor layer of a first conductivity type provided between the first electrode and the second electrode; a second semiconductor layer of the first conductivity type provided between the first semiconductor layer and the second electrode, and the second semiconductor layer having a lower impurity concentration than the first semiconductor layer; a first semiconductor region of a second conductivity type provided between part of the second semiconductor layer and the second electrode; a second semiconductor region of the second conductivity type provided between a portion different from the part of the second semiconductor layer and the second electrode, and the second semiconductor region being in contact with the first semiconductor region; and a third semiconductor region of the second conductivity type provided between at least part of the first semiconductor region and the second electrode, impurity concentration of the third semiconductor region at a surface in contact with the second electrode in the third semiconductor region being higher than impurity concentration of the first semiconductor region at a surface in contact with the second electrode in the first semiconductor region and impurity concentration of the second semiconductor region at a surface in contact with the second electrode in the second semiconductor region, and thickness of the second semiconductor layer sandwiched between the first semiconductor region and the first semiconductor layer being thinner than thickness of the second semiconductor layer sandwiched between the second semiconductor region and the first semiconductor layer.

Embodiments will now be described with reference to the drawings. In the following description, like members are labeled with like reference numerals. The description of the members once described is omitted appropriately. Examples shown in the figures are illustrative only, and can be combined as long as technically feasible. Such combinations are also encompassed within the scope of the embodiments.

First Embodiment

Figure 1B:
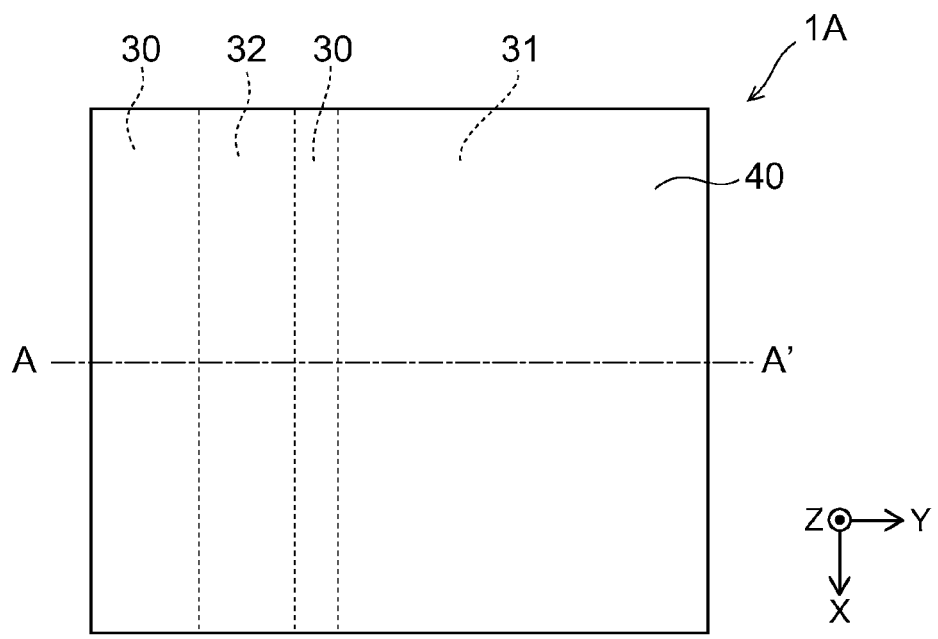

FIGS. 1A and 1B are schematic views of a semiconductor device according to a first embodiment. FIG. 1A is a schematic sectional view, and FIG. 1B is a schematic plan view.

FIG. 1A shows an A-A' cross section of FIG. 1B. The semiconductor device according to this embodiment is a pin (p-intrinsic-n) diode. The diode according to this embodiment is used as e.g. a free wheeling diode in an inverter circuit and the like. FIGS. 1A and 1B illustrate a minimum unit of the semiconductor device 1A.

As shown in FIG. 1A, the semiconductor device 1A includes a cathode electrode 10 (first electrode), an $n^+$-type cathode layer 20 (first semiconductor layer), an $n^-$-type base layer 21 (second semiconductor layer), a $p^-$-type anode region 30 (first semiconductor region), a $p^-$-type anode region 31 (second semiconductor region), a $p^+$-type anode region 32 (third semiconductor region), and an anode electrode 40 (second electrode). The $n^+$-type cathode layer 20, the $n^-$-type base layer 21, the $p^-$-type anode region 30, the $p^-$-type anode region 31, and the $p^+$-type anode region 32 are each provided between the cathode electrode 10 and the anode electrode 40.

The $n^+$-type cathode layer 20 is provided on the cathode electrode 10. The $n^+$-type cathode layer 20 is in ohmic contact with the cathode electrode 10. The $n^-$-type base layer 21 is provided on the $n^+$-type cathode layer 20.

The $p^-$-type anode region 30 is provided on part of the $n^-$-type base layer 21. This part refers to e.g. the portion of the $n^-$-type base layer 21 in the region 21A. The $p^-$-type anode region 31 is provided on a portion different from the aforementioned part of the $n^-$-type base layer 21. This different portion refers to e.g. the portion of the $n^-$-type base layer 21 in the region 21B. The $p^-$-type anode region 31 is in contact with the $p^-$-type anode region 30. The $p^+$-type anode region 32 is provided on at least part of the $p^-$-type anode region 30. For instance, in the first embodiment, the $p^+$-type anode region 32 is provided on part of the $p^-$-type anode region 30. The cross-sectional shape of the $p^+$-type anode region 32 is e.g. rectangular, circular or the like.

Thus, the p-type anode region of the semiconductor device 1A includes three regions, i.e., low concentration p-type semiconductor regions ($p^-$-type anode regions 30, 31) and a high concentration p-type semiconductor region ($p^+$-type anode region 32).

The anode electrode 40 is provided on the $p^-$-type anode region 30, the $p^-$-type anode region 31, and the $p^+$-type anode region 32. The $p^-$-type anode region 30 and the $p^-$-type anode region 31 bring the low concentration surface thereof into contact with the anode electrode 40. Typically, the $p^-$-type anode region 30 and the $p^-$-type anode region 31 are in Schottky contact with the anode electrode 40. However, the $p^-$-type anode region 30 and the $p^-$-type anode region 31 only need to have low impurity concentration, and do not necessarily need to be in Schottky contact with the anode electrode 40. The $p^+$-type anode region 32 is in ohmic contact with the anode electrode 40.

The concentration of the impurity element contained in the $n^-$-type base layer 21 is lower than the concentration of the impurity element contained in the $n^+$-type cathode layer 20. The concentration of the impurity element contained in the $n^-$-type base layer 21 may be made lower than the concentration of the impurity element contained in the $n^+$-type cathode layer 20 at the surface in contact with the cathode electrode 10 in the $n^+$-type cathode layer 20. The concentration of the impurity element contained in the $p^+$-type anode region 32 is higher than the concentration of the impurity element contained in the $p^-$-type anode region 30 and the concentration of the impurity element contained in the $p^-$-type anode region 31. For instance, the concentration of the impurity element contained in the $p^+$-type anode region 32 at the surface in contact with the anode electrode 40 in the $p^+$-type anode region 32 is higher than the concentration of the impurity element contained in the $p^-$-type anode region 30 at the surface in contact with the anode electrode 40 in the $p^-$-type anode region 30 and the concentration of the impurity element contained in the $p^-$-type anode region 31 at the surface in contact with the anode electrode 40 in the $p^-$-type anode region 31.

The embodiment also includes a configuration (not shown) in which an n-type buffer layer is provided between the $n^-$-type base layer 21 and the $n^+$-type cathode layer 20. The impurity concentration of the n-type buffer layer is between the concentration of the impurity element contained in the $n^-$-type base layer 21 and the concentration of the impurity element contained in the $n^+$-type cathode layer 20.

In the semiconductor device 1A, on the $n^+$-type cathode layer 20 side, a step difference is formed by the $p^-$-type anode region 30 and the $p^-$-type anode region 31. For instance, the thickness of the $n^-$-type base layer 21 sandwiched between the $p^-$-type anode region 30 and the $n^+$-type cathode layer 20 (thickness in the region 21A) is thinner than the thickness of the $n^-$-type base layer 21 sandwiched between the $p^-$-type anode region 31 and the $n^+$-type cathode layer 20 (thickness in the region 21B). Here, the "thickness" refers to the thickness of the $n^-$-type base layer 21 in the Z direction. That is, the semiconductor device 1A includes, on the anode side, a high concentration p-type semiconductor region ($p^+$-type anode region 32) and two low concentration p-type semiconductor regions having different depths ($p^-$-type anode region 30 and $p^-$-type anode region 31).

Such a step difference is thus provided in the low concentration p-type semiconductor region. Accordingly, the $p^-$-type anode region 30, having a deeper depth, includes a portion in which the junction between the $p^-$-type anode region 30 and the $n^-$-type base layer 21 is steeply curved. For instance, the $p^-$-type anode region 30 includes a curved portion 30c in which the junction between the $p^-$-type anode region 30 and the $n^-$-type base layer 21 is steeply curved. At least near directly above the curved portion 30c, the $p^+$-type anode region 32 is located. Here, "At least near directly above" refers to the portion directly above the curved portion 30c or the portion above a position separated by a prescribed distance in the X direction or Y direction from the curved portion 30c.

As shown in FIG. 1B, in the semiconductor device 1A, the p⁻-type anode region 30 and the p⁺-type anode region 32 extend in one direction (X direction in the figure) on the n⁻-type base layer 21.

The n⁺-type cathode layer 20, the n⁻-type base layer 21, the p⁻-type anode region 30, the p⁻-type anode region 31, and the p⁺-type anode region 32 are each composed primarily of e.g. silicon (Si). As the impurity element of the conductivity type such as n⁺-type, n⁻-type, and n-type (first conductivity type), for instance, phosphorus (P), arsenic (As) or the like is used. As the impurity element of the conductivity type such as p⁺-type, p⁻-type, and p-type (second conductivity type), for instance, boron (B) or the like is used.

The surface impurity concentration of the n⁺-type cathode layer 20 is higher than $3 \times 10^{17}$ cm⁻³, such as $1 \times 10^{19}$ cm⁻³ or more. The impurity concentration of the n⁺-type cathode layer 20 may be made higher toward the cathode electrode 10 side. The impurity concentration of the n⁻-type base layer 21 is $1 \times 10^{15}$ cm⁻³ or less, and can be set to an arbitrary impurity concentration depending on the design of the device breakdown voltage. The surface impurity concentration of the p⁻-type anode region 30 and the p⁻-type anode region 31 is e.g. $3 \times 10^{17}$ cm⁻³ or less. The surface impurity concentration of the p⁺-type anode region 32 is higher than $3 \times 10^{17}$ cm⁻³, such as $1 \times 10^{19}$ cm⁻³ or more. The impurity concentration of these p-type layers may be made higher toward the anode electrode 40 side.

The aforementioned "impurity concentration" refers to the effective concentration of the impurity element contributing to the conductivity of the semiconductor material. For instance, in the case where the semiconductor material contains an impurity element serving as donor and an impurity element serving as acceptor, the "impurity concentration" refers to the concentration of activated impurities except the amount of donor and acceptor canceling each other.

In this embodiment, unless otherwise specified, n⁺-type, n-type, and n⁻-type in this order represent the concentration of the n-type impurity element in the decreasing order. Furthermore, p⁺-type, p-type, and p⁻-type in this order represent the concentration of the p-type impurity element in the decreasing order. For instance, unless otherwise specified, by the statement that the impurity concentration of the n⁺-type semiconductor region is higher than the impurity concentration of the n⁻-type semiconductor region, the embodiment also encompasses the case where the impurity concentration of the n⁺-type semiconductor region at the surface in contact with the cathode electrode 10 in the n⁺-type semiconductor region is higher than the impurity concentration of the n⁻-type semiconductor region. Furthermore, by the statement that the impurity concentration of the p⁺-type semiconductor region is higher than the impurity concentration of the p⁻-type semiconductor region, the embodiment also encompasses the case where the impurity concentration of the p⁺-type semiconductor region at the surface in contact with the anode electrode 40 in the p⁺-type semiconductor region is higher than the impurity concentration of the p⁻-type semiconductor region at the surface in contact with the anode electrode 40 in the p⁻-type semiconductor region.

The material of the cathode electrode 10 and the material of the anode electrode 40 are e.g. a metal containing at least one selected from the group consisting of aluminum (Al), titanium (Ti), nickel (Ni), tungsten (W), gold (Au) and the like.

For example, the material of the anode electrode 40 are e.g. a metal containing at least one selected from the group consisting of platinum (Pt), titanium (Ti), nickel (Ni), tungsten (W), gold (Au) and the like when the p⁻-type anode region 30, 31 is in Schottky contact with the anode electrode 40.

Figure 2A:
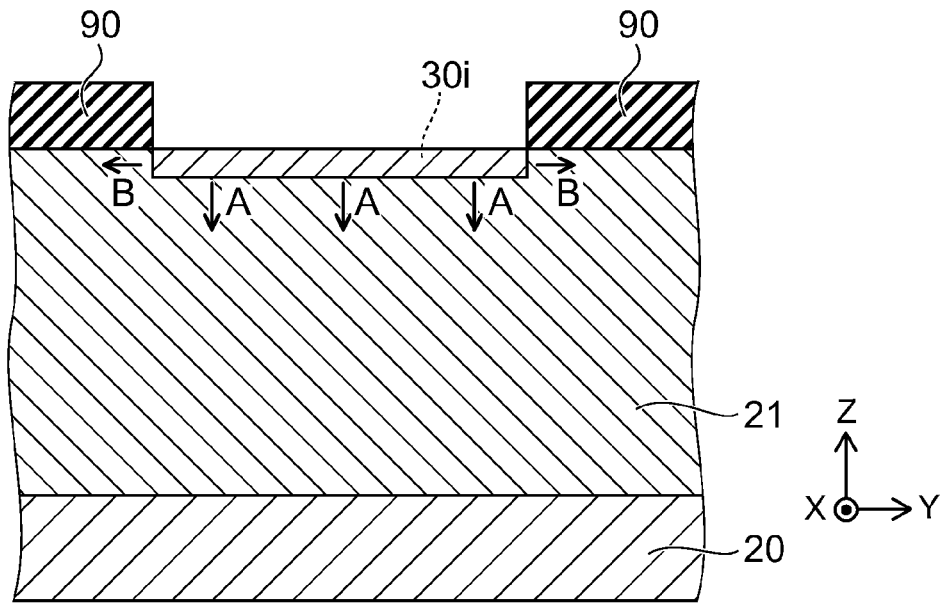
FIGS. 2A and 2B are schematic sectional views showing a process for manufacturing the p$^-$-type anode region of the semiconductor device according to the first embodiment.
Figure 2B:
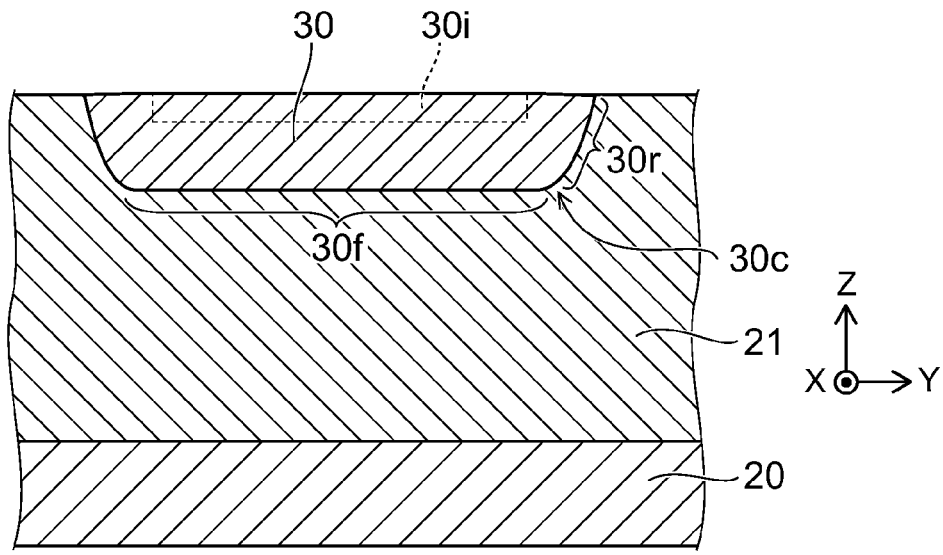

FIGS. 2A and 2B are schematic sectional views showing a process for manufacturing the p⁻-type anode region of the semiconductor device according to the first embodiment. FIG. 2A is a schematic sectional view immediately after ion implantation. FIG. 2B is a schematic sectional view after heat treatment.

First, as shown in FIG. 2A, ion implantation is performed on the surface of the n⁻-type base layer 21 exposed from a mask 90 before forming the p⁻-type anode region 30. The mask 90 extends in the X direction in the figure. The material of the mask 90 includes e.g. resist or silicon oxide ($SiO_2$).

For instance, an impurity element such as boron (B) is implanted into the surface of the n⁻-type base layer 21 exposed from the mask 90. Thus, on the n⁻-type base layer 21, a p-type ion implantation layer 30i having a thinner thickness than the p⁻-type anode region 30 is formed.

Next, as shown in FIG. 2B, heat treatment is performed on the ion implantation layer 30i and the n⁻-type base layer 21 to activate the p-type impurity element. By this heat treatment, the impurity element in the ion implantation layer 30i is diffused from the ion implantation layer 30i to the n⁺-type cathode layer 20 side (direction A in the figure), and from the ion implantation layer 30i in the lateral direction (direction B in the figure). The p⁻-type anode region 30 formed by the diffusion of the p-type impurity element contains the p-type impurity element such that the concentration thereof exceeds the concentration of n-type impurity contained in the n⁻-type base layer 21.

Here, the impurity element diffused in the direction A is diffused one-dimensionally from the ion implantation layer 30i to the n⁺-type cathode layer 20 side. On the other hand, the impurity element diffused in the direction B is diffused from the ion implantation layer 30i in the lateral direction. Thus, the impurity element diffused in the direction B is diffused in the direction parallel to the interface between the n⁺-type cathode layer 20 and the n⁻-type base layer 21. That is, the impurity element diffused from the ion implantation layer 30i in the lateral direction is diffused two-dimensionally. Thus, the diffusion rate of the impurity element diffused in the direction B is slower than the diffusion rate of the impurity element diffused in the direction A. This slowdown is made more significant toward the surface of the n⁻-type base layer 21.

Thus, after activation, the junction between the p⁻-type anode region 30 and the n⁻-type base layer 21 includes a bottom portion 30f opposed to the n⁺-type cathode layer 20, and a side portion 30r extending from both ends of the bottom portion 30f to the surface of the n⁻-type base layer 21. The junction between the p⁻-type anode region 30 and the n⁻-type base layer 21 includes a curved portion 30c at which the bottom portion 30f and the side portion 30r intersect.

The operation of the semiconductor device 1A is now described.

Figure 3:
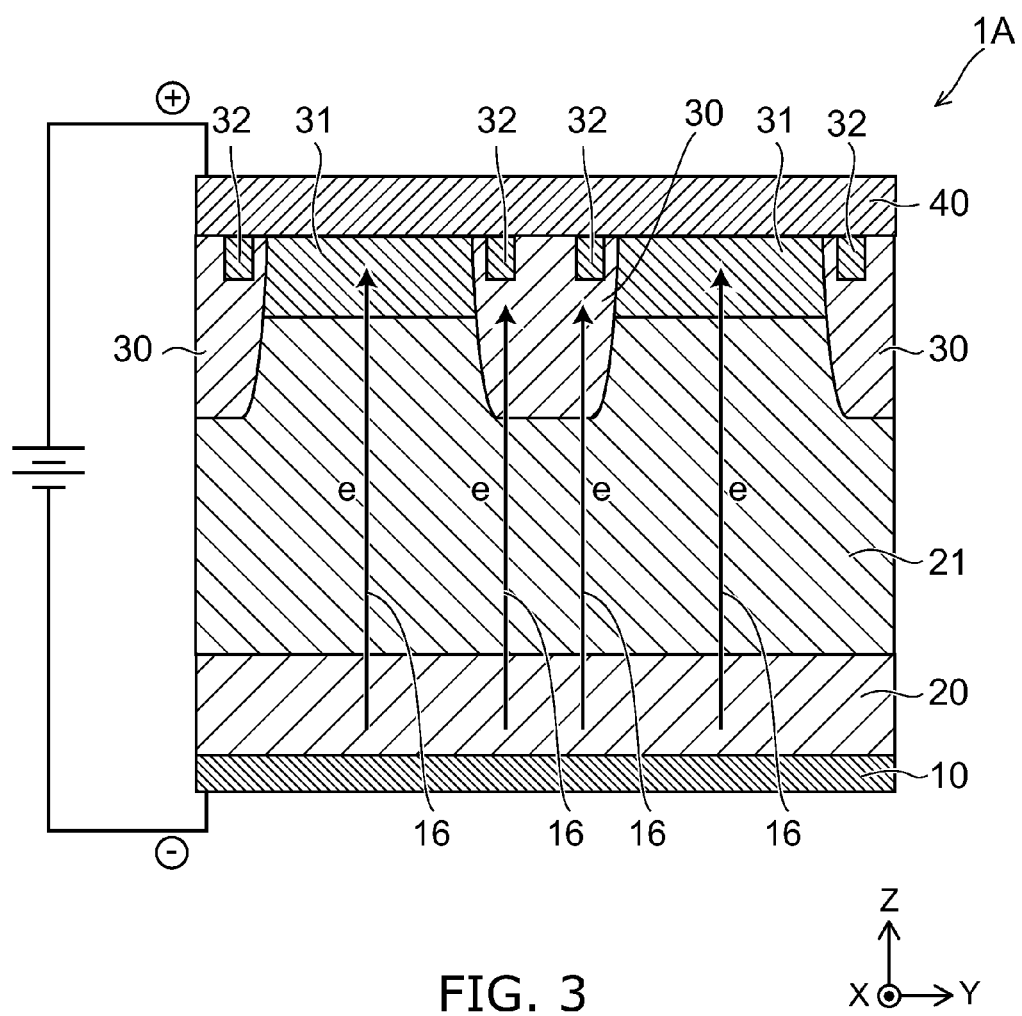
FIG. 3 is a schematic sectional view showing the operation of the on-state of the semiconductor device according to the first embodiment.

FIG. 3 is a schematic sectional view showing the operation of the on-state of the semiconductor device according to the first embodiment.

FIG. 3 shows a plurality of minimum units collected in the Y direction. In the semiconductor device 1A, a plurality of p⁻-type anode regions 30 are separated from each other on the n⁻-type base layer 21.

First, the electron current flowing from the cathode side to the anode side is described.

In the on-state, a forward bias voltage is applied between the cathode and the anode. That is, a voltage is applied between the cathode and the anode so that the potential of the anode electrode 40 is made higher than the potential of the cathode electrode 10. For instance, a voltage is applied between the cathode and the anode so that the anode electrode 40 is made positive and the cathode electrode 10 is made negative.

Here, the n$^+$-type cathode layer 20 is in ohmic contact with the cathode electrode 10. Thus, electrons (e) move from the n$^+$-type cathode layer 20 through the n$^-$-type base layer 21 to the p$^-$-type anode region 30, 31.

The p$^-$-type anode region 30, 31 is in resistive contact or Schottky contact with the anode electrode 40. This is a resistive contact or Schottky contact made of p-type semiconductor and metal. Thus, the interface between the p$^-$-type anode region 30, 31 and the anode electrode 40 does not constitute an energy barrier for electrons.

Accordingly, electrons flow from the n$^+$-type cathode layer 20 through the n$^-$-type base layer 21 and the p$^-$-type anode region 30, 31 into the anode electrode 40. Thus, an electron current 16 is formed between the cathode and the anode.

Next, the hole current flowing from the anode side to the cathode side is described.

Figure 4:
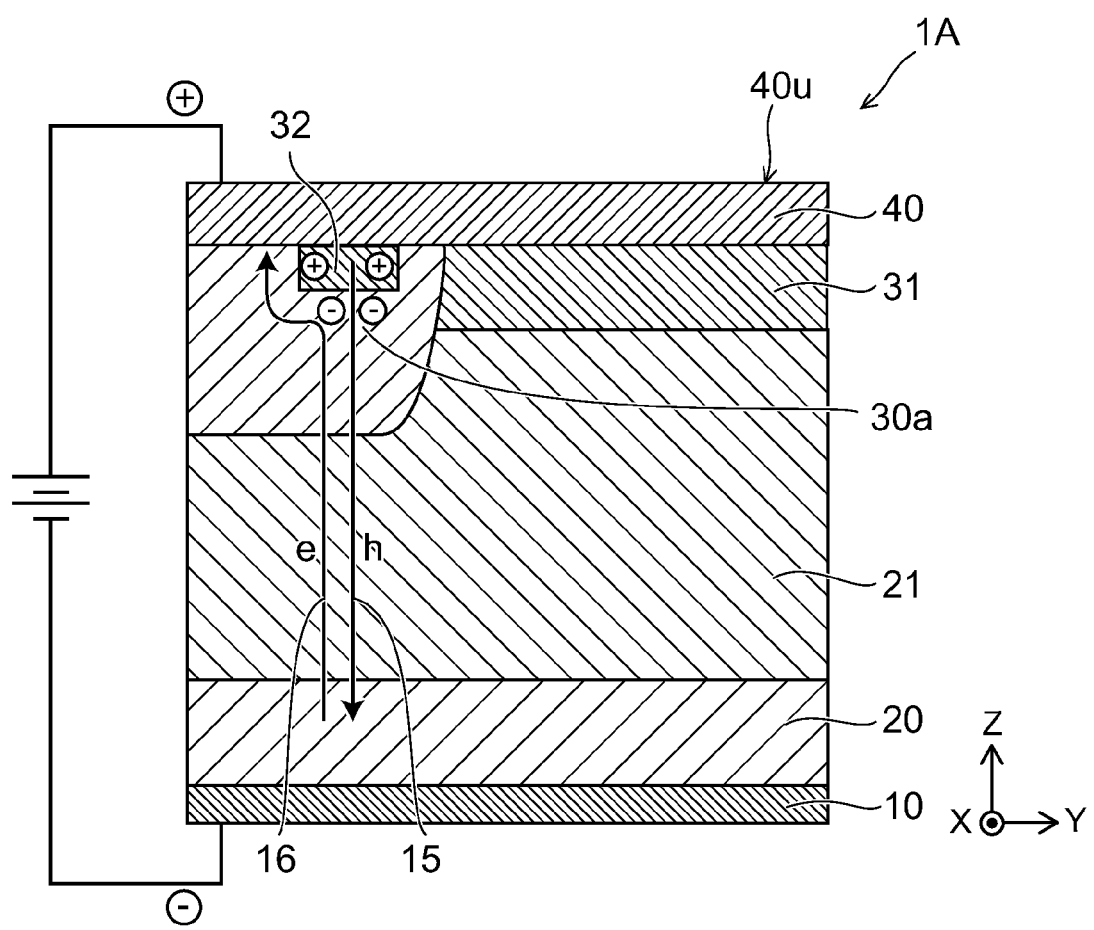
FIG. 4 is a schematic sectional view showing the operation of the on-state of the semiconductor device according to the first embodiment.

FIG. 4 is a schematic sectional view showing the operation of the on-state of the semiconductor device according to the first embodiment.

FIG. 4 shows a minimum unit of the semiconductor device 1A.

As described above, the interface between the p$^-$-type anode region 30, 31 and the anode electrode 40 does not constitute an energy barrier for electrons. However, the interface between the p$^+$-type anode region 32 and the p$^-$-type anode region 30 constitutes an energy barrier for electrons. Thus, the electrons having flowed to the p$^-$-type anode region 30 do not easily flow into the p$^+$-type anode region 32.

Accordingly, electrons flow from the cathode side toward the anode side and reach near the p$^+$-type anode region 32. Then, below the p$^+$-type anode region 32, the electrons migrate in the lateral direction, i.e., in the direction generally parallel to the upper surface 40u of the anode electrode 40.

By this migration of electrons near the p$^-$-type anode region 30, the portion 30a located below the p$^+$-type anode region 32 is biased to be negative with respect to the p$^+$-type anode region 32 in contact with the anode electrode 40, i.e., with respect to the anode electrode 40.

By the bias formed between the portion 30a and the anode electrode 40, the energy barrier against holes between the p$^-$-type anode region 30 and the p$^+$-type anode region 32 is lowered below the p$^+$-type anode region 32. Thus, holes are injected from the p$^+$-type anode region 32 into the p$^-$-type anode region 30. The injected holes form a hole current 15.

The hole current 15 increases with the increase of the width in the Y direction of the p$^+$-type anode region 32, or the contact area between the p$^+$-type anode region 32 and the anode electrode 40. In other words, the amount of holes injected from the anode side is adjusted by that width or that contact area.

Furthermore, in the on-state, a forward bias is applied between the p$^-$-type anode region 30, 31 and the n$^-$-type base layer 21. Hence, naturally, holes and electrons flow through the p-n junction.

Thus, in the on-state, holes flow from the anode side to the cathode side, and electrons flow from the cathode side to the anode side. Here, on the anode side, holes are injected from the p$^+$-type anode region 32. In contrast, the p$^-$-type anode region 30, 31 contributes only to ejection of electrons.

Thus, compared with the semiconductor device without the p$^-$-type anode region 30, 31, the amount of injected holes is suppressed. This accelerates the switching speed of the semiconductor device 1A.

Figure 5:
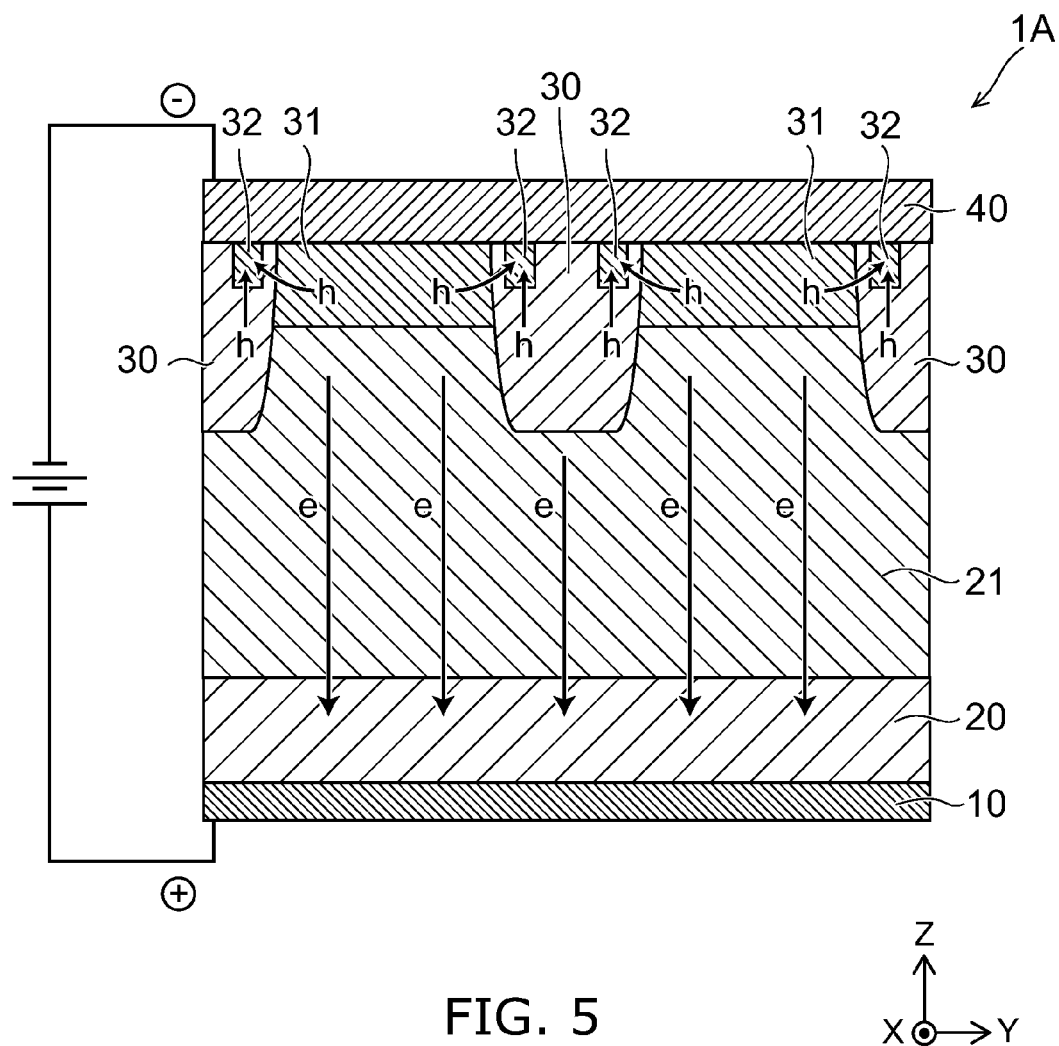
FIG. 5 is a schematic sectional view showing the operation of the turn-off state of the semiconductor device according to the first embodiment.

FIG. 5 is a schematic sectional view showing the operation of the turn-off state of the semiconductor device according to the first embodiment.

FIG. 5 shows the state at turn-off time when the forward bias applied between the anode and the cathode is switched to a reverse bias. For instance, a voltage is applied between the cathode and the anode so that the anode electrode 40 is made negative and the cathode electrode 10 is made positive.

The forward bias applied between the anode and the cathode is switched to a reverse bias applied between the anode and the cathode. Then, holes existing in the n$^-$-type base layer 21 move to the anode electrode 40 side. Electrons existing in the n$^-$-type base layer 21 move to the cathode electrode 10 side.

At the time of reverse bias application, electrons flow through the n$^+$-type cathode layer 20 into the cathode electrode 10. On the other hand, at the time of reverse bias application, holes flow through the p$^+$-type anode region 32 into the anode electrode 40.

At turn-off time, electrons flow to the cathode electrode 10, and holes flow to the anode electrode 40. In this state, starting from the junction between the p$^-$-type anode region 30, 31 and the n$^-$-type base layer 21, a depletion layer spreads to the n$^-$-type base layer 21 and the p$^-$-type anode region 30, 31. The conduction between the anode electrode 40 and the cathode electrode 10 is gradually cut off in the semiconductor device 1A.

However, in a pin diode, electric field concentration typically occurs at some position of the p-n junction at turn-off time, and may cause avalanche.

Figure 6:
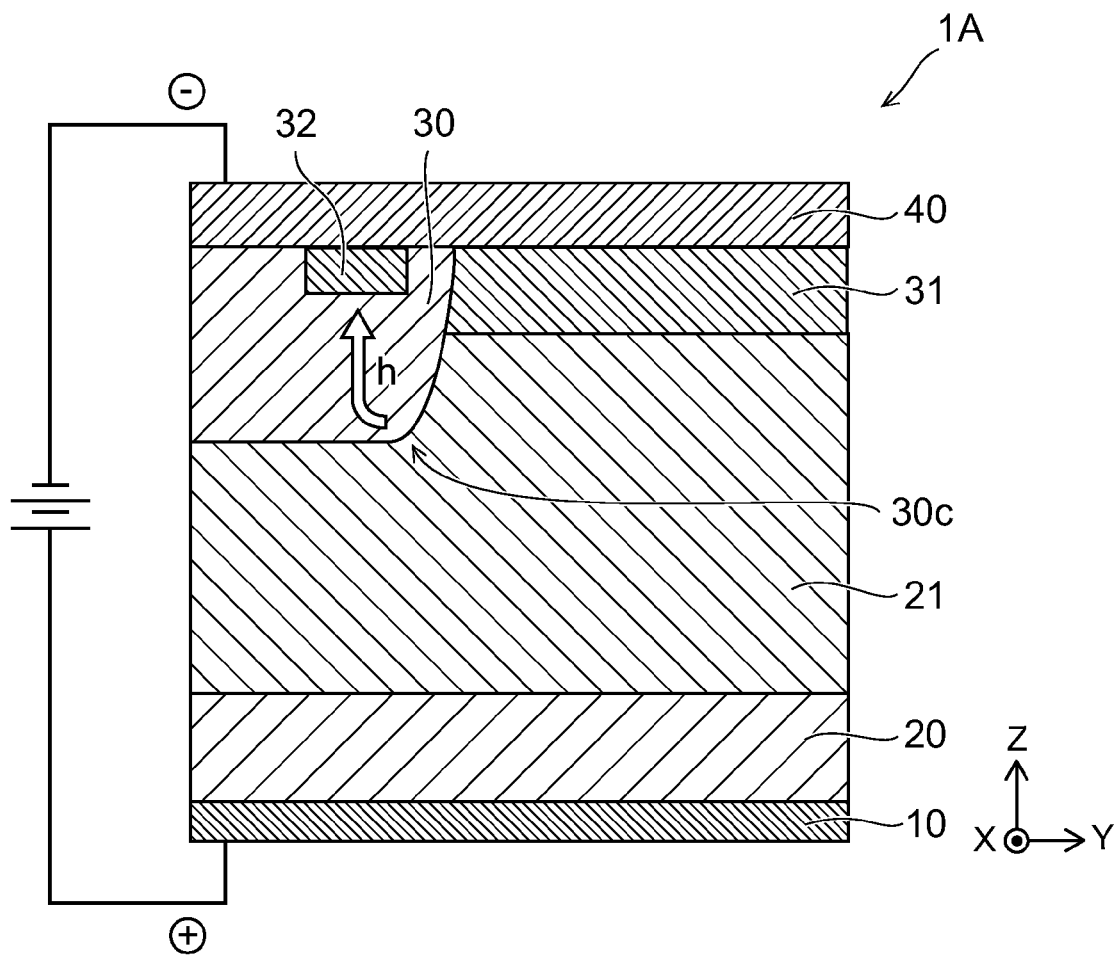
FIG. 6 is a schematic sectional view showing the operation of the turn-off state of the semiconductor device according to the first embodiment.

FIG. 6 is a schematic sectional view showing the operation of the turn-off state of the semiconductor device according to the first embodiment.

For instance, in the semiconductor device 1A, the p-type anode region includes three regions, i.e., the p$^-$-type anode region 30, the p$^-$-type anode region 31, and the p$^+$-type anode region 32. Furthermore, the p$^-$-type anode region 30 includes a curved portion 30c in which the p-n junction is steeply curved. Due to the pointed shape of this curved portion 30c, electric field is made likely to concentrate on the curved portion 30c at turn-off time. Thus, avalanche is made likely to occur near the curved portion 30c. The flow of holes generated by avalanche is referred to avalanche current.

The p$^+$-type anode region 32 is located at least near directly above the curved portion 30c. Thus, holes generated by avalanche are ejected through the p$^+$-type anode region 32 to the anode electrode 40.

The semiconductor device 1A includes a plurality of curved portions 30c (FIG. 5). In the semiconductor device 1A, avalanche is made likely to occur in each of the plurality of curved portions 30c. Thus, avalanche occurs at dispersed positions. Accordingly, the avalanche current is also dispersed over the plurality of curved portions 30c. The avalanche current is ejected through the plurality of p$^+$-type anode regions 32 to the anode electrode 40. Therefore, the breakdown withstand capability of the semiconductor device 1A comes to increase at turn-off time.

Furthermore, in the semiconductor device 1A, the avalanche current is ejected preferentially through the p$^+$-type anode region 32 to the anode electrode 40. Thus, the injection of holes from the anode side in the on-state can also be further suppressed by further decreasing the impurity concentration of the p$^-$-type anode region 30, 31.

As described above, in the semiconductor device 1A according to the first embodiment, the acceleration of switching speed is compatible with the increase of breakdown withstand capability at turn-off time. This expands the safe operating area at turn-off time.

Reference Example

Figure 7:
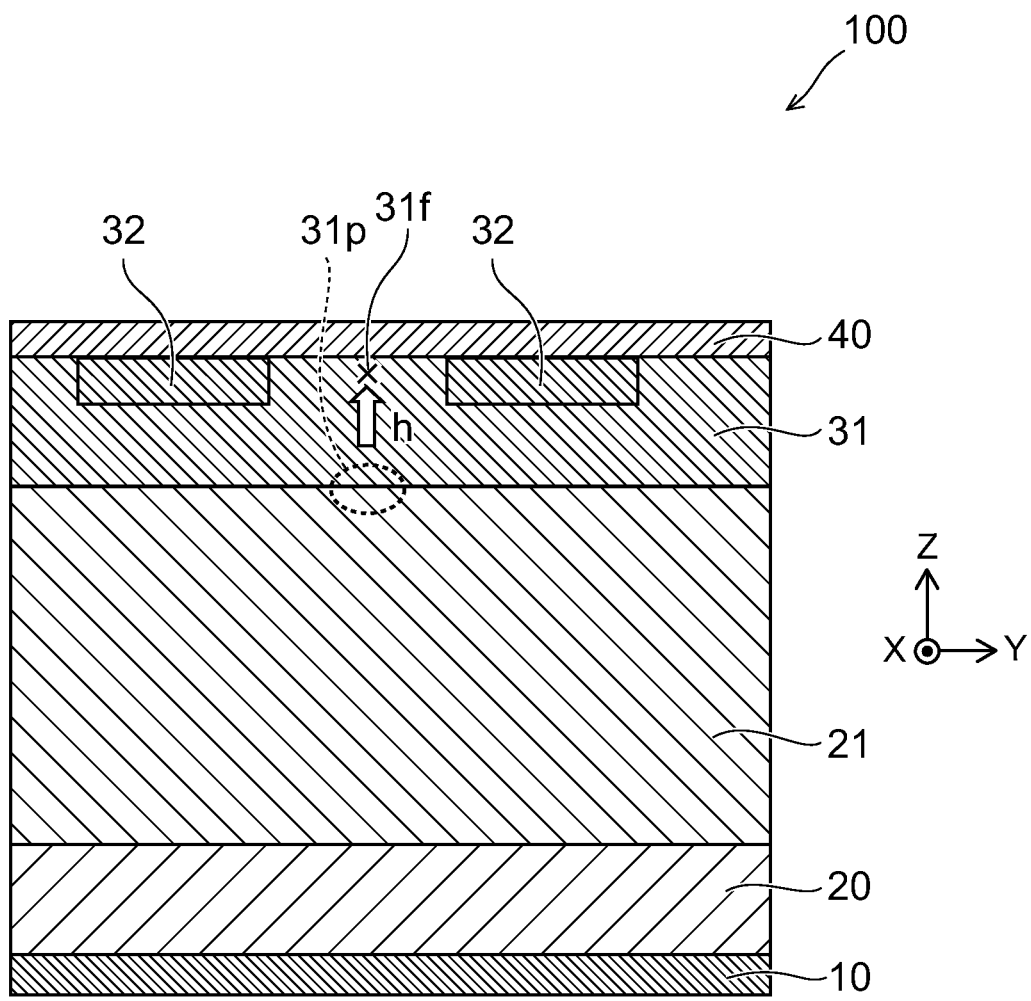
FIG. 7 is a schematic sectional view showing the operation of the turn-off state of a semiconductor device according to a reference example.

FIG. 7 is a schematic sectional view showing the operation of the turn-off state of a semiconductor device according to a reference example.

In the semiconductor device 100 according to the reference example, on the anode side, a p$^-$-type anode region 31 and a p$^+$-type anode region 32 are provided. However, in the semiconductor device 100, the aforementioned p$^-$-type anode region 30 is not provided. Thus, the boundary between the p$^-$-type anode region 31 and the n$^-$-type base layer 21 is nearly flat.

Also in the semiconductor device 100, on the anode side, the p$^-$-type anode region 31 is provided in addition to the p$^+$-type anode region 32. This suppresses the amount of holes injected from the anode side. However, at turn-off time, electric field concentration may occur at some position of the p-n junction. Avalanche may occur at the position subjected to electric field concentration.

For instance, FIG. 7 illustrates a state in which avalanche has occurred at a position 31p between the adjacent p$^+$-type anode regions 32. Once avalanche is caused at such a position 31p, avalanche continues preferentially at the position 31p. Thus, a large amount of avalanche current is generated from the position 31p.

In the semiconductor device 100, the aforementioned p$^+$-type anode region 32 is not provided above the position 31p. Furthermore, the p$^-$-type anode region 31 has low concentration. Thus, the p$^-$-type anode region 31 is in high resistance contact or Schottky contact with the anode electrode 40. Accordingly, in the semiconductor device 100, the avalanche current is ejected less easily to the anode electrode 40 than in the semiconductor device 1A.

Because of the high resistance contact or Schottky contact between the p$^-$-type anode region 31 and the anode electrode 40, the avalanche current generated at the position 31p does not flow directly to the anode electrode 40. That is, the avalanche current flows through a surface position 31f of the p$^-$-type anode region 31 into the p$^+$-type anode region 32, and further flows to the anode electrode 40. At this time, in the semiconductor device 100, a bias is applied to the high resistance contact or Schottky contact between the surface position 31f of the p$^-$-type anode region 31 and the anode electrode 40. This causes a problem of degradation in breakdown withstand capability.

Thus, in the semiconductor device 100, the breakdown withstand capability at turn-off time is not made so high as in the semiconductor device 1A.

Furthermore, in the semiconductor device 100, excessively decreasing the impurity concentration of the p$^-$-type anode region 31 to decrease hole injection from the anode side causes withstand capability degradation at turn-off time. Thus, the decrease of the concentration of the p$^-$-type anode region 31 is also limited. This is because current concentration is made likely to occur only in part of the p$^-$-type anode region 31 at turn-off time.

(Variations of the First Embodiment)

Figure 8A:
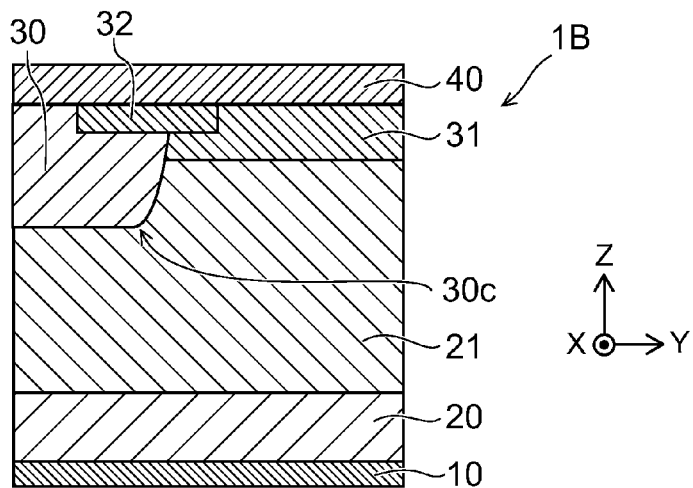
FIGS. 8A to 8C are schematic sectional views of semiconductor devices according to variations of the first embodiment.
Figure 8B:
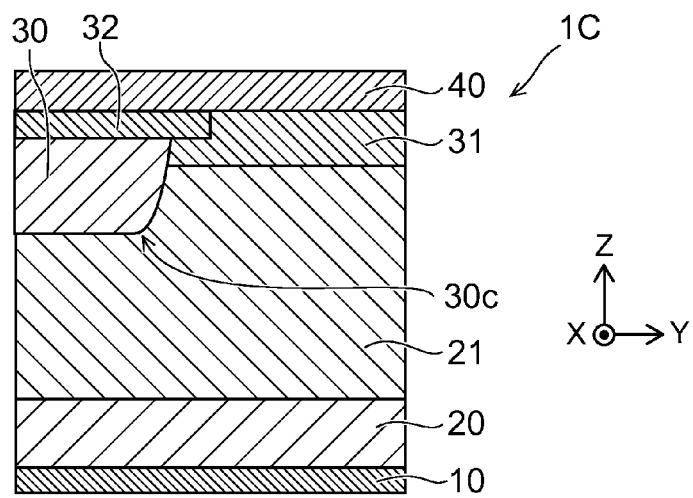
Figure 8C:
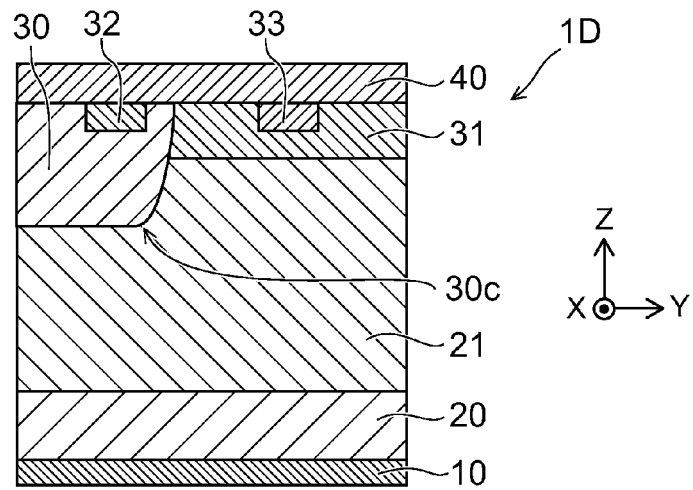

FIGS. 8A to 8C are schematic sectional views of semiconductor devices according to variations of the first embodiment. FIG. 8A is a schematic sectional view of a semiconductor device according to a first variation. FIG. 8B is a schematic sectional view of a semiconductor device according to a second variation. FIG. 8C is a schematic sectional view of a semiconductor device according to a third variation.

In the semiconductor device 1B shown in FIG. 8A, the p$^+$-type anode region 32 is provided on part of the p$^-$-type anode region 30, and further provided on part of the p$^-$-type anode region 31. That is, the p$^+$-type anode region 32 is provided astride the p$^-$-type anode region 30 and the p$^-$-type anode region 31.

In such a structure, the upper side of the curved portion 30c is covered with the p$^+$-type anode region 32 having a larger contact area. Thus, the avalanche current is ejected more efficiently to the anode electrode 40 side.

In the semiconductor device 1C shown in FIG. 8B, the p$^+$-type anode region 32 is provided entirely on the p$^-$-type anode region 30, and further provided on part of the p$^-$-type anode region 31.

In such a structure, the upper side of the curved portion 30c is covered with the p$^+$-type anode region 32 having an even larger contact area. Thus, the avalanche current is ejected more efficiently to the anode electrode 40 side.

As seen from the embodiment illustrated in FIGS. 8A and 8B, the p$^+$-type anode region 32 is provided on at least part of the p$^-$-type anode region 30.

Furthermore, a plurality of p$^+$-type anode regions 32 may be provided in the minimum unit.

For instance, in the semiconductor device 1D shown in FIG. 8C, a p$^+$-type anode region 33 (fourth semiconductor region) having a concentration comparable to that of the p$^+$-type anode region 32 is provided on part of the p$^-$-type anode region 31. The p$^+$-type anode region 33 is in ohmic contact with the anode electrode 40. For instance, the concentration of the impurity element contained in the p$^+$-type anode region 33 at the surface in contact with the anode electrode 40 in the p$^+$-type anode region 33 is higher than the concentration of the impurity element contained in the p$^-$-type anode region 30 at the surface in contact with the anode electrode 40 in the p$^-$-type anode region 30 and the concentration of the impurity element contained in the p$^-$-type anode region 31 at the surface in contact with the anode electrode 40 in the p$^-$-type anode region 31.

In such a structure, by a plurality of p$^+$-type anode regions, the avalanche current is ejected more efficiently to the anode electrode 40 side.

Second Embodiment

Figure 9A:
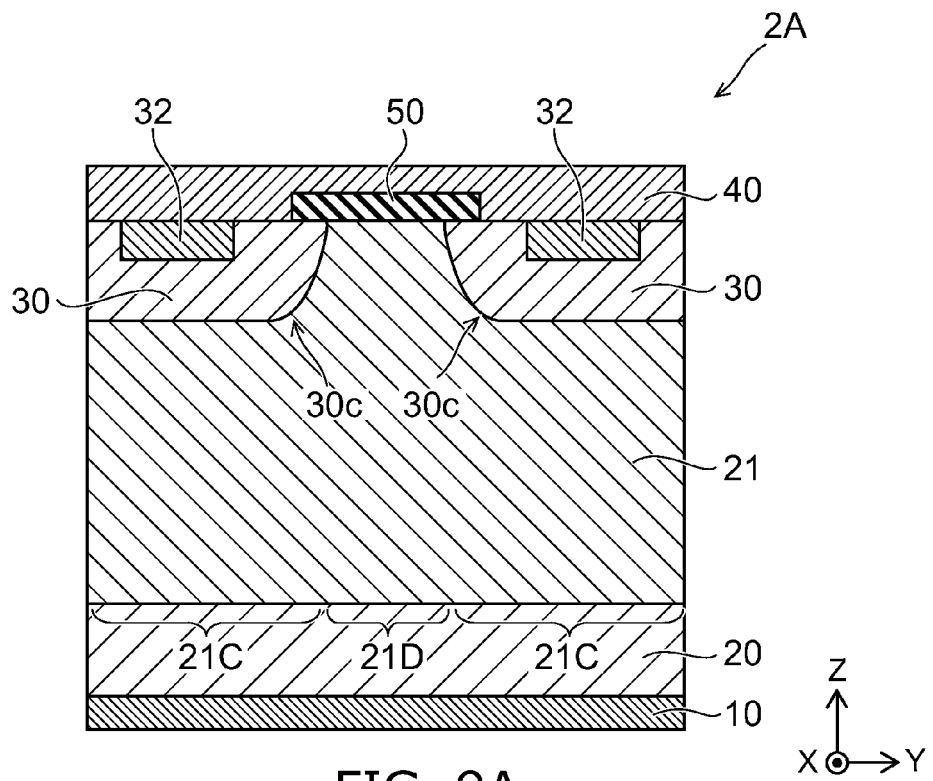
FIGS. 9A and 9B are schematic views of a semiconductor device according to a second embodiment.
Figure 9B:
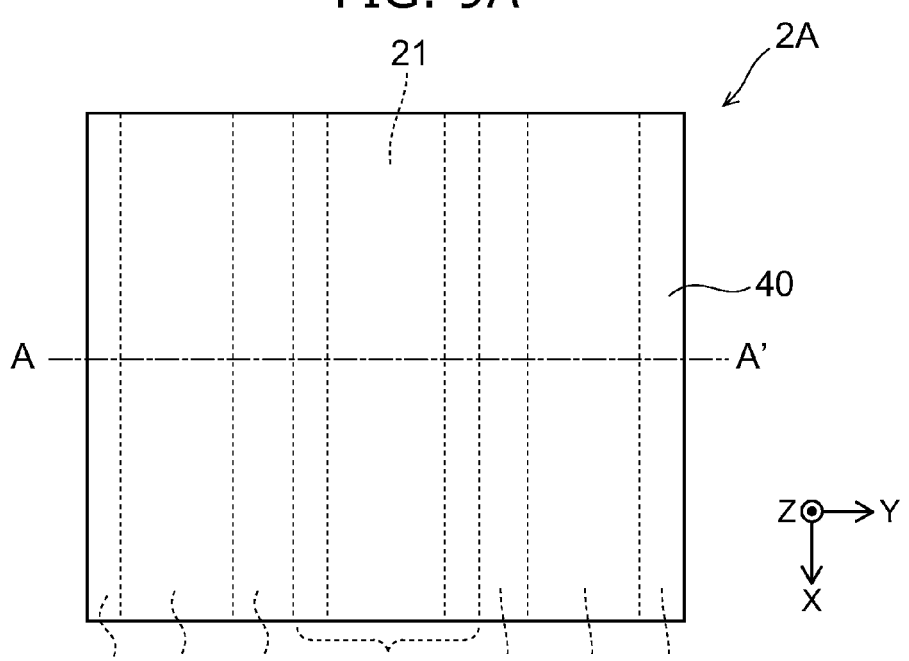

FIGS. 9A and 9B are schematic views of a semiconductor device according to a second embodiment. FIG. 9A is a schematic sectional view, and FIG. 9B is a schematic plan view.

FIG. 9A shows an A-A' cross section of FIG. 9B. FIGS. 9A and 9B illustrate a minimum unit of the semiconductor device 2A.

As shown in FIG. 9A, the semiconductor device 2A includes a cathode electrode 10, an n$^+$-type cathode layer 20, an n$^-$-type base layer 21, a p$^-$-type anode region 30, an insulating layer 50, a p$^+$-type anode region 32, and an anode electrode 40. The cathode electrode 10, the n$^+$-type cathode layer 20, the n$^-$-type base layer 21, the p$^-$-type anode region 30, the insulating layer 50, and the p$^+$-type anode region 32 are provided between the cathode electrode 10 and the anode electrode 40.

The n$^+$-type cathode layer 20 is provided on the cathode electrode 10. The n$^-$-type base layer 21 is provided on the n$^+$-type cathode layer 20. The impurity concentration of the n$^-$-type base layer 21 is lower than the impurity concentration of the n$^+$-type cathode layer 20. The p$^-$-type anode region 30 is provided on part of the n⁻-type base layer 21. This part refers to e.g. the portion of the n⁻-type base layer 21 in the region 21C. The insulating layer 50 is provided on a portion different from the aforementioned part of the n⁻-type base layer 21. This different portion refers to the portion not provided with the p⁻-type anode region 30. This different portion refers to e.g. the portion of the n⁻-type base layer 21 in the region 21D. The insulating layer 50 is in contact with the p⁻-type anode region 30.

The p⁺-type anode region 32 is provided on part of the p⁻-type anode region 30. The anode electrode 40 is provided on at least one of the p⁻-type anode region 30 and the p⁺-type anode region 32. In FIG. 9A, by way of example, the anode electrode 40 is provided on the p⁻-type anode region 30, the insulating layer 50, and the p⁺-type anode region 32. The p⁻-type anode region 30 brings the low concentration surface thereof into contact with the anode electrode 40. Typically, the p⁻-type anode region 30 is in Schottky contact with the anode electrode 40. However, the p⁻-type anode region 30 only needs to have low impurity concentration. The p⁻-type anode region 30 does not necessarily need to be in Schottky contact with the anode electrode 40. The p⁺-type anode region 32 is in ohmic contact with the anode electrode 40.

The thickness of the n⁻-type base layer 21 sandwiched between the p⁻-type anode region 30 and the n⁺-type cathode layer 20 (thickness in the region 21C) is thinner than the thickness of the n⁻-type base layer 21 in the portion not provided with the p⁻-type anode region 30 (thickness in the region 21D). In other words, the thickness of the n⁻-type base layer 21 sandwiched between the p⁻-type anode region 30 and the n⁺-type cathode layer 20 is thinner than the thickness of the n⁻-type base layer 21 sandwiched between the insulating layer 50 and the n⁺-type cathode layer 20. This produces a step difference between the p⁻-type anode region 30 and the insulating layer 50. Thus, the p⁻-type anode region 30 includes a curved portion 30c in which the junction between the p⁻-type anode region 30 and the n⁻-type base layer 21 is steeply curved.

As shown in FIG. 9B, in the semiconductor device 2A, the p⁻-type anode region 30, the p⁺-type anode region 32, and the insulating layer 50 extend in one direction (X direction in the figure) on the n⁻-type base layer 21. The material of the insulating layer 50 includes e.g. resist or silicon oxide (SiO₂).

The operation of the semiconductor device 2A is now described.

In the on-state, a forward bias is applied between the anode and the cathode. Thus, holes flow from the anode side to the cathode side, and electrons flow from the cathode side to the anode side. Furthermore, on the anode side, the p⁻-type anode region 30 is provided in addition to the p⁺-type anode region 32. This suppresses the amount of injected holes.

In the turn-off state, a reverse bias is applied between the anode and the cathode. Thus, holes existing in the n⁻-type base layer 21 move to the anode electrode 40 side. Electrons existing in the n⁻-type base layer 21 move to the cathode electrode 10 side. Then, electrons flow through the n⁺-type cathode layer 20 into the cathode electrode 10. On the other hand, at the time of reverse bias application, holes flow through the p⁺-type anode region 32 into the anode electrode 40.

At turn-off time, electrons flow to the cathode electrode 10, and holes flow to the anode electrode 40. In this state, starting from the junction between the p⁻-type anode region 30 and the n⁻-type base layer 21, a depletion layer spreads to the n⁻-type base layer 21 and the p⁻-type anode region 30. The conduction between the anode electrode 40 and the cathode electrode 10 is cut off gradually in the semiconductor device 2A.

Furthermore, at turn-off time, electric field is made likely to concentrate on the curved portion 30c. Thus, avalanche is made likely to occur near the curved portion 30c. The p⁺-type anode region 32 is located near the curved portion 30c. Thus, holes generated by avalanche are ejected through the p⁺-type anode region 32 to the anode electrode 40.

The semiconductor device 2A illustrated in FIGS. 9A and 9B is a minimum unit, and includes a plurality of curved portions 30c. In the semiconductor device 2A, avalanche is made likely to occur in each of the plurality of curved portions 30c. Thus, avalanche occurs at dispersed positions. Furthermore, the avalanche current is ejected through the plurality of p⁺-type anode regions 32 to the anode electrode 40. This increases the breakdown withstand capability of the semiconductor device at turn-off time.

Furthermore, in the semiconductor device 2A, the p⁻-type anode region 30 is provided in addition to the p⁺-type anode region 32. This suppresses the amount of holes injected from the anode side in the on-state. Accordingly, compared with the diode in which only the p⁺-type anode region 32 is brought into contact with the anode electrode 40, the carrier concentration on the anode electrode 40 side in the conducting state is suppressed. Thus, in the semiconductor device 2A, the switching speed is accelerated.

Furthermore, in the semiconductor device 2A, the avalanche current is ejected preferentially through the p⁺-type anode region 32 to the anode electrode 40. Thus, the injection of holes from the anode side can also be further suppressed by further decreasing the impurity concentration of the p⁻-type anode region 30.

Furthermore, in the semiconductor device 2A, the insulating layer 50 is interposed between the anode electrode 40 and the n⁻-type base layer 21. This realizes a prescribed breakdown voltage without contact between the anode electrode 40 and the n⁻-type base layer 21.

As described above, in the semiconductor device 2A according to the second embodiment, the acceleration of switching speed is compatible with the increase of breakdown withstand capability at turn-off time.

(Variations of the Second Embodiment)

FIGS. 10A to 10C are schematic sectional views of semiconductor devices according to variations of the second embodiment. FIG. 10A is a schematic sectional view of a semiconductor device according to a first variation. FIG. 10B is a schematic sectional view of a semiconductor device according to a second variation. FIG. 10C is a schematic sectional view of a semiconductor device according to a third variation.

In the semiconductor device 2B shown in FIG. 10A, the p⁺-type anode region 32 is provided on part of the p⁻-type anode region 30. The p⁺-type anode region 32 is provided above the curved portion 30c of the p⁻-type anode region 30. That is, the curved portion 30c is covered with the p⁺-type anode region 32. Thus, the avalanche current is ejected more efficiently to the anode electrode 40 side.

In the semiconductor device 2C shown in FIG. 10B, a p⁺-type anode region 34 is provided on a portion different from the aforementioned part of the p⁻-type anode region 30. The p⁺-type anode region 34 is in ohmic contact with the anode electrode 40. For instance, the concentration of the impurity element contained in the p⁺-type anode region 34 at the surface in contact with the anode electrode 40 in the p⁺-type anode region 34 is higher than the concentration of the impurity element contained in the p⁻-type anode region 30 at the surface in contact with the anode electrode 40 in the p⁻-type anode region 30. That is, in the semiconductor device 2C, a plurality of p⁺-type anode regions are provided on the p⁻-type anode region 30.

In such a structure, by a plurality of p⁺-type anode regions, the avalanche current is ejected more efficiently to the anode electrode 40 side.

In the semiconductor device 2D shown in FIG. 10C, the p⁺-type anode region 32 is provided astride the divided p⁻-type anode regions 30. The p⁺-type anode region 32 is provided on part of the p⁻-type anode region 30. In addition, the p⁺-type anode region 32 is provided on the n⁻-type base layer 21 in the portion not provided with the p⁻-type anode region 30. Furthermore, in the semiconductor device 2D, the aforementioned insulating layer 50 is not provided. The p⁺-type anode region 32 is in ohmic contact with the anode electrode 40. This structure realizes a prescribed breakdown voltage without requiring the insulating layer 50 between the anode electrode 40 and the n⁻-type base layer 21.

In such a structure, acceleration is easily realized without decreasing the prescribed breakdown voltage. Thus, the avalanche current is ejected more efficiently to the anode electrode 40 side.

Third Embodiment

Figure 11A:
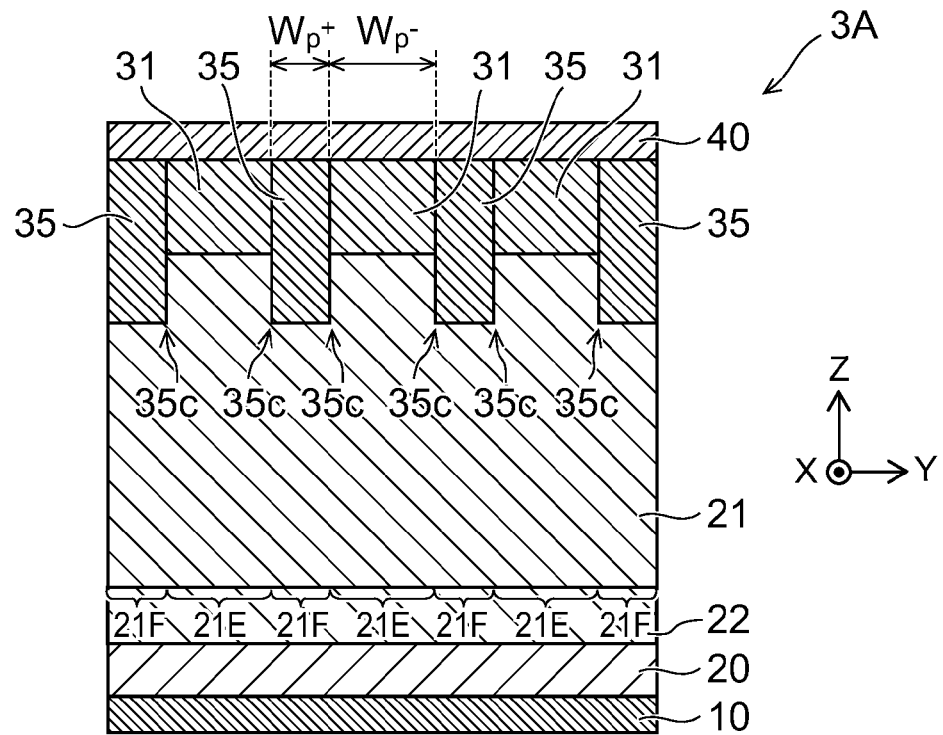
FIGS. 11A and 11B are schematic views of a semiconductor device according to a third embodiment.
Figure 11B:
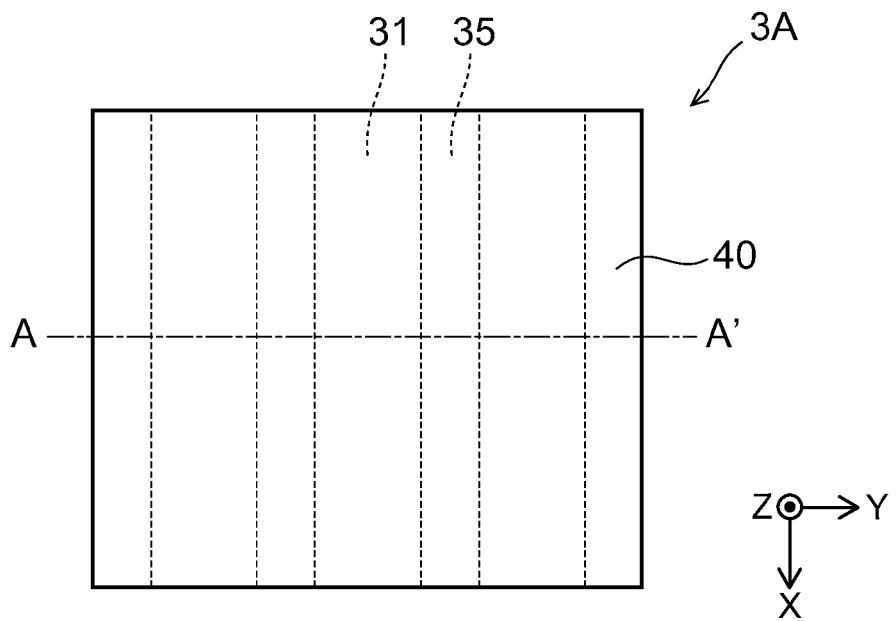

FIGS. 11A and 11B are schematic views of a semiconductor device according to a third embodiment. FIG. 11A is a schematic sectional view, and FIG. 11B is a schematic plan view.

FIG. 11A shows an A-A' cross section of FIG. 11B.

As shown in FIG. 11A, the semiconductor device 3A includes a cathode electrode 10, an n⁺-type cathode layer 20, an n-type buffer layer 22, an n⁻-type base layer 21, a p⁻-type anode region 31, a p⁺-type anode region 35, and an anode electrode 40. The n⁺-type cathode layer 20, the n-type buffer layer 22, the n⁻-type base layer 21, the p⁻-type anode region 31, and the p⁺-type anode region 35 are provided between the cathode electrode 10 and the anode electrode 40.

The n⁺-type cathode layer 20 is provided on the cathode electrode 10. The n-type buffer layer 22 is provided on the n⁺-type cathode layer 20. The n⁻-type base layer 21 is provided on the n-type buffer layer 22. The concentration of the impurity element contained in the n-type buffer layer 22 is lower than the concentration of the impurity element contained in the n⁺-type cathode layer 20. The concentration of the impurity element contained in the n⁻-type base layer 21 is lower than the concentration of the impurity element contained in the n-type buffer layer 22.

The p⁻-type anode region 31 is provided on part of the n⁻-type base layer 21. The part refers to e.g. the portion of the n⁻-type base layer 21 in the region 21E. The p⁺-type anode region 35 is provided on a portion different from the aforementioned part of the n⁻-type base layer 21. The different portion refers to e.g. the portion of the n⁻-type base layer 21 in the region 21F.

The p⁺-type anode region 35 is in contact with the p⁻-type anode region 31. A plurality of p⁺-type anode regions 35 are separated from each other on the n⁻-type base layer 21. In other words, the p⁻-type anode region 31 is sandwiched between a pair of p⁺-type anode regions 35. The concentration of the impurity element contained in the p⁺-type anode region 35 is higher than the concentration of the impurity element contained in the p⁻-type anode region 31. The impurity concentration of the p⁺-type anode region 35 is set comparable to e.g. the impurity concentration of the aforementioned p⁺-type anode region 32. Specifically, the concentration of the impurity element contained in the p⁺-type anode region 35 at the surface in contact with the anode electrode 40 in the p⁺-type anode region 35 is higher than the concentration of the impurity element contained in the p⁻-type anode region 31 at the surface in contact with the anode electrode 40 in the p⁻-type anode region 31.

The anode electrode 40 is provided on the p⁺-type anode region 35 and the p⁻-type anode region 31. The p⁺-type anode region 35 is in ohmic contact with the anode electrode 40.

The cross-sectional shape of the p⁺-type anode region 35 may be a striped structure in which the length in the Z direction is longer than that in the Y direction. Alternatively, the cross-sectional shape may be circular. The thickness of the n⁻-type base layer 21 sandwiched between the p⁺-type anode region 35 and the n⁺-type cathode layer 20 is thinner than the thickness of the n⁻-type base layer 21 sandwiched between the p⁻-type anode region 31 and the n⁺-type cathode layer 20.

The width Wp⁺ of the p⁺-type anode region 35 in the Y direction (first direction) in which the p⁺-type anode region 35 and the p⁻-type anode region 31 are arranged is narrower than the width Wp⁻ of the p⁻-type anode region 31 in the Y direction. The width Wp⁺ of the p⁺-type anode region 35 is e.g. 1-10 μm. The width Wp⁻ of the p⁻-type anode region 31 is e.g. 5-100 μm. The p⁺-type anode region 35 includes a curved portion 35c in which the junction between the p⁺-type anode region 35 and the n⁻-type base layer 21 is steeply curved. In the semiconductor device 3A, the curved portion 35c constitutes a corner.

In the semiconductor device 3A, on the n⁺-type cathode layer 20 side, a step difference is formed by the p⁺-type anode region 35 and the p⁻-type anode region 31. By the provision of such a step difference, the p⁺-type anode region 35 having a deeper depth includes a curved portion 35c.

As shown in FIG. 11B, in the semiconductor device 3A having a striped structure, the p⁺-type anode region 35 extends in one direction (X direction in the figure) on the n⁻-type base layer 21.

A process for manufacturing the semiconductor device 3A is now described.

Figure 12A:
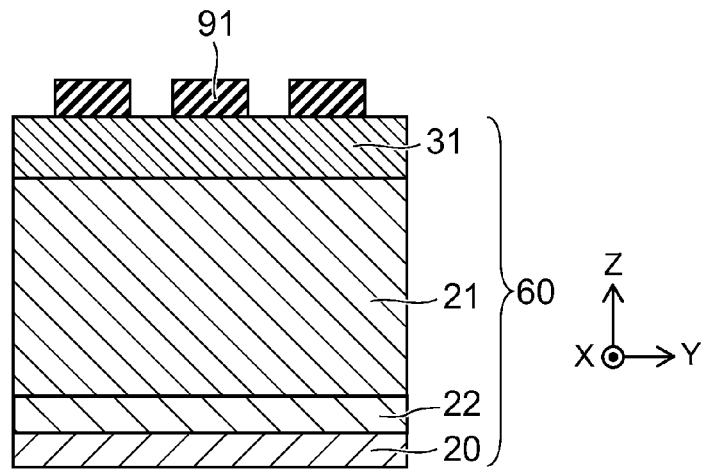
FIGS. 12A to 12C are schematic sectional views showing the process for manufacturing the semiconductor device according to the third embodiment.
Figure 12B:
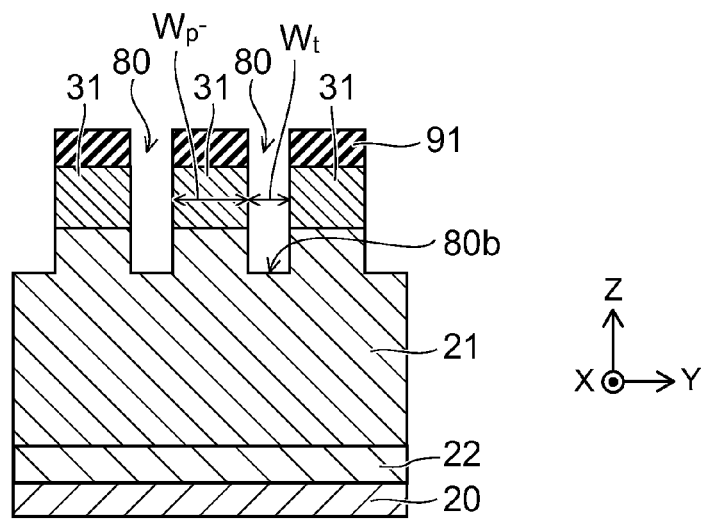
Figure 12C:
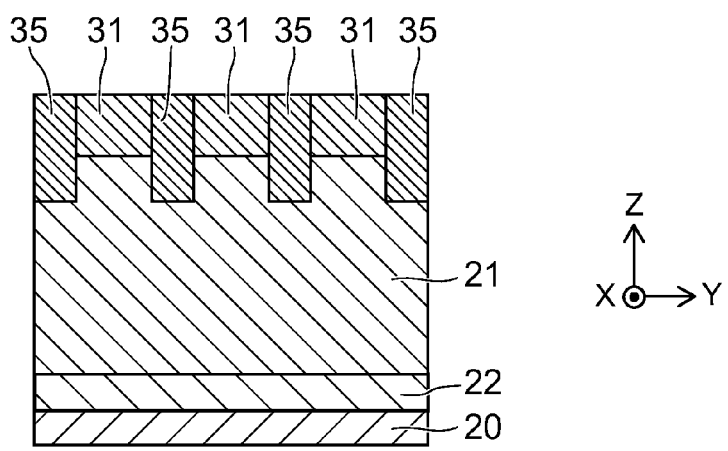

FIGS. 12A to 12C are schematic sectional views showing the process for manufacturing the semiconductor device according to the third embodiment.

First, as shown in FIG. 12A, a semiconductor stacked body 60 including an n⁺-type cathode layer 20, an n-type buffer layer 22, an n⁻-type base layer 21, and a p⁻-type anode region 31 is prepared. Subsequently, on the p⁻-type anode region 31, a mask 91 is patterned. The material of the mask 91 includes e.g. resist or silicon oxide ($SiO_2$).

Next, as shown in FIG. 12B, RIE (reactive ion etching) processing is performed on the semiconductor stacked body 60 exposed from the mask 91. By RIE processing, a trench 80 penetrating through the p⁻-type anode region 31 and digging part of the n⁻-type base layer 21 is formed. RIE processing is effective in forming a trench 80 with high aspect ratio. The width Wt of the trench 80 is adjusted to be narrower than the width Wp⁻ of the p⁻-type anode region 31 sandwiched between the trenches 80. The bottom surface 80b of the trench 80 is located below the boundary between the n⁻-type base layer 21 and the p⁻-type anode region 31.

Next, as shown in FIG. 12C, a p⁺-type anode region 35 is formed in the trench 80. The formation of the p⁺-type anode region 35 is performed by e.g. CVD (chemical vapor deposition), epitaxial growth technique and the like. After the p⁺-type anode region 35 is formed, an anode electrode 40 and a cathode electrode 10 are formed. By such a manufacturing process, the semiconductor device 3A is formed.

The operation of the semiconductor device 3A is now described.

In the on-state, a forward bias is applied between the anode and the cathode. Thus, holes flow from the anode side to the cathode side, and electrons flow from the cathode side to the anode side.

Here, on the anode side, the width $Wp^+$ of the $p^+$-type anode region 35 is narrower than the width $Wp^-$ of the $p^-$-type anode region 31. This suppresses the amount of holes injected from the anode side.

In the turn-off state, a reverse bias is applied between the anode and the cathode. Thus, holes existing in the $n^-$-type base layer 21 move to the anode electrode 40 side. Electrons existing in the $n^-$-type base layer 21 move to the cathode electrode 10 side. Then, electrons flow through the n-type buffer layer 22 and the $n^+$-type cathode layer 20 into the cathode electrode 10. On the other hand, at the time of reverse bias application, holes flow through the $p^+$-type anode region 35 into the anode electrode 40.

At turn-off time, electrons flow to the cathode electrode 10, and holes flow to the anode electrode 40. In this state, starting from the junction of the $p^-$-type anode region 31 and the $p^+$-type anode region 35 with the $n^-$-type base layer 21, a depletion layer spreads to the $n^-$-type base layer 21 and the $p^-$-type anode region 31 and the $p^+$-type anode region 35. The conduction between the anode electrode 40 and the cathode electrode 10 is cut off gradually in the semiconductor device 3A.

Furthermore, at turn-off time, electric field is made likely to concentrate on the curved portion 35c. Thus, avalanche is made likely to occur near the curved portion 35c. In the semiconductor device 3A, holes generated by avalanche are ejected through the $p^+$-type anode region 35 to the anode electrode 40. That is, the $p^+$-type anode region 35 has the function of causing avalanche, and also functions as a path for ejecting the avalanche current to the anode electrode 40.

The semiconductor device 3A includes a plurality of curved portions 35c. In the semiconductor device 3A, avalanche is made likely to occur in each of the plurality of curved portions 35c. Thus, avalanche occurs at dispersed positions. The avalanche current is ejected through the plurality of $p^+$-type anode regions 35 to the anode electrode 40. This increases the breakdown withstand capability of the semiconductor device at turn-off time.

Furthermore, in the semiconductor device 3A, the width $Wp^+$ of the $p^+$-type anode region 35 is adjusted to be narrower than the width $Wp^-$ of the $p^-$-type anode region 31. Thus, compared with the semiconductor device in which the width $Wp^+$ of the $p^+$-type anode region 35 is adjusted to be wider than or equal to the width $Wp^-$ of the $p^-$-type anode region 31, the amount of holes injected from the anode side is suppressed. Thus, in the semiconductor device 3A, the switching speed is accelerated.

Furthermore, in the semiconductor device 3A, the avalanche current is ejected preferentially through the $p^+$-type anode region 35 to the anode electrode 40. Thus, the injection of holes from the anode side in the on-state can also be further suppressed by further decreasing the impurity concentration of the $p^-$-type anode region 31.

Furthermore, the $p^+$-type anode region 35 of the semiconductor device 3A is not formed by ion implantation technique and thermal diffusion technique. Instead, after forming a trench 80, the $p^+$-type anode region 35 is formed by film formation (CVD, epitaxial growth technique and the like) into the trench 80. Thus, a semiconductor device ensuring width $Wp^+<$ width $Wp^-$ is formed.

As described above, in the semiconductor device 3A according to the third embodiment, the acceleration of switching speed is compatible with the increase of breakdown withstand capability at turn-off time.

(First Variation of the Third Embodiment)

Figure 13:
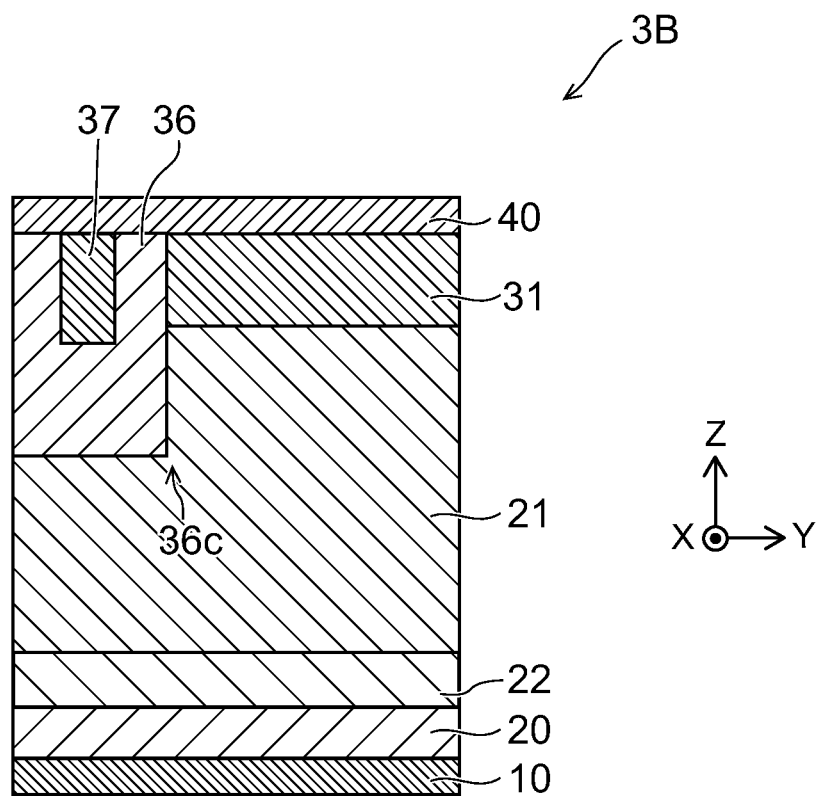
FIG. 13 is a schematic sectional view of a semiconductor device according to a first variation of the third embodiment.

FIG. 13 is a schematic sectional view of a semiconductor device according to a first variation of the third embodiment.

FIG. 13 shows a minimum unit of the semiconductor device 3B according to the first variation of the third embodiment.

As shown in FIG. 13, the semiconductor device 3B includes a cathode electrode 10, an $n^+$-type cathode layer 20, an n-type buffer layer 22, an $n^-$-type base layer 21, a $p^-$-type anode region 31, a $p^-$-type anode region 36, a $p^+$-type anode region 37, and an anode electrode 40. The $n^+$-type cathode layer 20, the n-type buffer layer 22, the $n^-$-type base layer 21, the $p^-$-type anode region 31, the $p^-$-type anode region 36, and the $p^+$-type anode region 37 are provided between the cathode electrode 10 and the anode electrode 40.

The concentration of the impurity element contained in the $p^-$-type anode region 36 is as low as the concentration of the impurity element contained in the $p^-$-type anode region 31. For instance, the concentration of the impurity element contained in the $p^-$-type anode region 36 at the surface in contact with the anode electrode 40 in the $p^-$-type anode region 36 is comparable to the concentration of the impurity element contained in the $p^-$-type anode region 31 at the surface in contact with the anode electrode 40 in the $p^-$-type anode region 31. The concentration of the impurity element contained in the $p^+$-type anode region 37 is comparable to the concentration of the impurity element contained in the aforementioned $p^+$-type anode region 35.

For instance, the concentration of the impurity element contained in the $p^+$-type anode region 37 at the surface in contact with the anode electrode 40 in the $p^+$-type anode region 37 is higher than the concentration of the impurity element contained in the $p^-$-type anode region 36 at the surface in contact with the anode electrode 40 in the $p^-$-type anode region 36 and the concentration of the impurity element contained in the $p^-$-type anode region 31 at the surface in contact with the anode electrode 40 in the $p^-$-type anode region 31.

The $p^+$-type anode region 37 is in ohmic contact with the anode electrode 40. The $p^-$-type anode region 36 is typically in Schottky contact with the anode electrode 40. However, the $p^-$-type anode region 36 only needs to have low impurity concentration. The $p^-$-type anode region 36 does not necessarily need to be in Schottky contact with the anode electrode 40.

The $p^-$-type anode region 31 is provided on part of the $n^-$-type base layer 21. The $p^-$-type anode region 36 is provided on a portion different from the aforementioned part of the $n^-$-type base layer 21. The $p^+$-type anode region 37 is provided on part of the $p^-$-type anode region 36. The concentration of the impurity element contained in the $p^+$-type anode region 37 is higher than the concentration of the impurity element contained in the $p^-$-type anode region 31, 36.

In the cross-sectional shape of the $p^-$-type anode region 36, the length in the Z direction is longer than that in the Y direction. The thickness of the $n^-$-type base layer 21 sandwiched between the $p^-$-type anode region 36 and the $n^+$-type cathode layer 20 is thinner than the thickness of the $n^-$-type base layer 21 sandwiched between the $p^-$-type anode region 31 and the $n^+$-type cathode layer 20. The $p^-$-type anode region 36 includes a curved portion 36c in which the junction between the $p^-$-type anode region 36 and the $n^-$-type base layer 21 is steeply curved.

In the semiconductor device 3B, on the n$^+$-type cathode layer 20 side, a step difference is formed by the p$^-$-type anode region 36 and the p$^-$-type anode region 31. By the provision of such a step difference, the p$^-$-type anode region 36 having a deeper depth includes a curved portion 36c.

A process for manufacturing the semiconductor device 3B is now described.

Figure 14A:
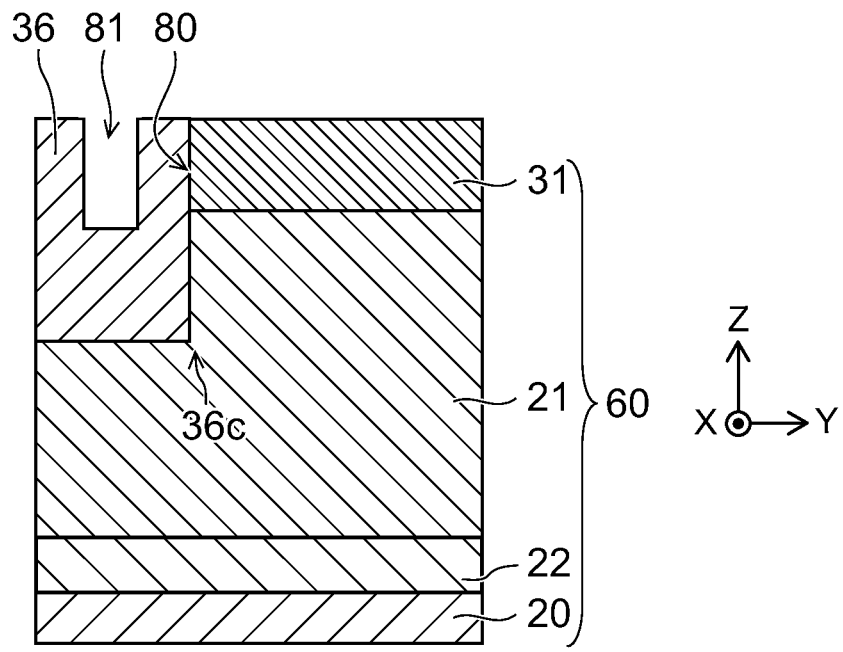
FIGS. 14A and 14B are schematic sectional views showing the process for manufacturing the semiconductor device according to the first variation of the third embodiment.
Figure 14B:
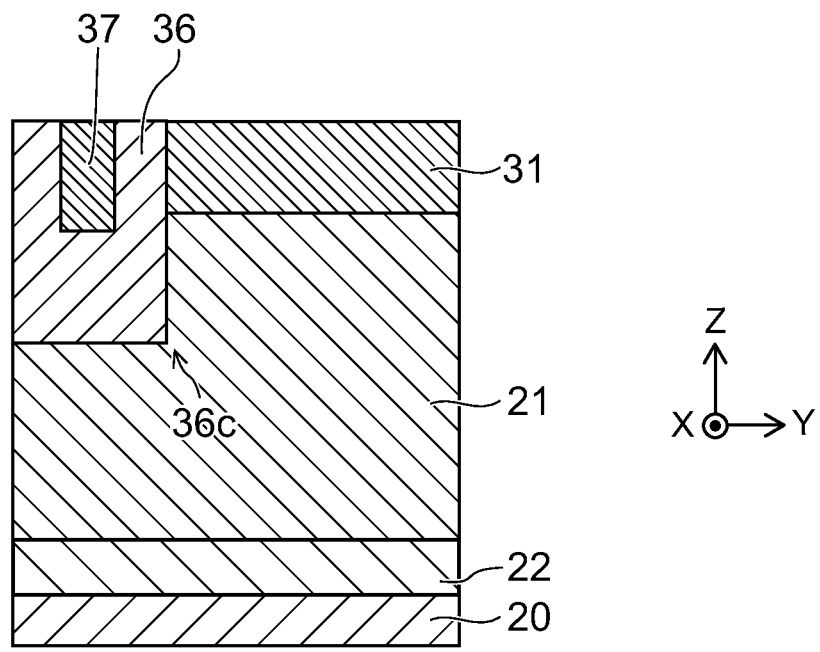

FIGS. 14A and 14B are schematic sectional views showing the process for manufacturing the semiconductor device according to the first variation of the third embodiment.

First, a semiconductor stacked body 60 with the aforementioned trench 80 formed therein is prepared (see FIG. 12B).

Next, as shown in FIG. 14A, a p$^-$-type anode region 36 is formed in the trench 80. The formation of the p$^-$-type anode region 36 is performed by e.g. CVD (chemical vapor deposition), epitaxial growth technique and the like. In the formation of the p$^-$-type anode region 36, the trench 80 is not completely filled with the p$^-$-type anode region 36. That is, the p$^-$-type anode region 36 is formed so that a trench 81 is left inside the p$^-$-type anode region 36.

Next, as shown in FIG. 14B, a p$^+$-type anode region 37 is formed in the trench 81. The formation of the p$^+$-type anode region 37 is performed by e.g. CVD (chemical vapor deposition), epitaxial growth technique and the like. After the p$^+$-type anode region 37 is formed, an anode electrode 40 and a cathode electrode 10 are formed. By such a manufacturing process, the semiconductor device 3B is formed.

The operation of the semiconductor device 3B is now described.

In the on-state, a forward bias is applied between the anode and the cathode. Thus, holes flow from the anode side to the cathode side, and electrons flow from the cathode side to the anode side.

Here, on the anode side, the p$^-$-type anode regions 31, 36 are provided in addition to the p$^+$-type anode region 37. This suppresses the amount of holes injected from the anode side.

In the turn-off state, a reverse bias is applied between the anode and the cathode. Thus, holes existing in the n$^-$-type base layer 21 move to the anode electrode 40 side. Electrons existing in the n$^-$-type base layer 21 move to the cathode electrode 10 side. Then, electrons flow through the n-type buffer layer 22 and the n$^+$-type cathode layer 20 into the cathode electrode 10. On the other hand, at the time of reverse bias application, holes flow through the p$^+$-type anode region 37 into the anode electrode 40.

At turn-off time, electrons flow to the cathode electrode 10, and holes flow to the anode electrode 40. In this state, starting from the junction between the p$^-$-type anode region 31, 36 and the n$^-$-type base layer 21, a depletion layer spreads to the n$^-$-type base layer 21 and the p$^-$-type anode region 31, 36. The conduction between the anode electrode 40 and the cathode electrode 10 is cut off gradually in the semiconductor device 3B.

Furthermore, at turn-off time, electric field is made likely to concentrate on the curved portion 36c. Thus, avalanche is made likely to occur near the curved portion 36c. In the semiconductor device 3B, holes generated by avalanche are ejected through the p$^+$-type anode region 37 to the anode electrode 40.

The semiconductor device 3B includes a plurality of curved portions 36c. In the semiconductor device 3B, avalanche is made likely to occur in each of the plurality of curved portions 36c. Thus, avalanche occurs at dispersed positions. The avalanche current is ejected through the plurality of p$^+$-type anode regions 37 to the anode electrode 40. This increases the breakdown withstand capability of the semiconductor device at turn-off time.

Furthermore, in the semiconductor device 3B, the p$^-$-type anode regions 31, 36 are provided in addition to the p$^+$-type anode region 37. This suppresses the amount of holes injected from the anode side in the on-state compared with the semiconductor device not provided with the p$^-$-type anode regions 31, 36. Thus, in the semiconductor device 3B, the switching speed is accelerated.

Furthermore, in the semiconductor device 3B, the avalanche current is ejected preferentially through the p$^+$-type anode region 37 to the anode electrode 40. Thus, the injection of holes from the anode side can also be further suppressed by further decreasing the impurity concentration of the p$^-$-type anode region 31, 36.

As described above, in the semiconductor device 3B according to the third embodiment, the acceleration of switching speed is compatible with the increase of breakdown withstand capability at turn-off time.

(Second and Third Variations of the Third Embodiment)

Figure 15A:
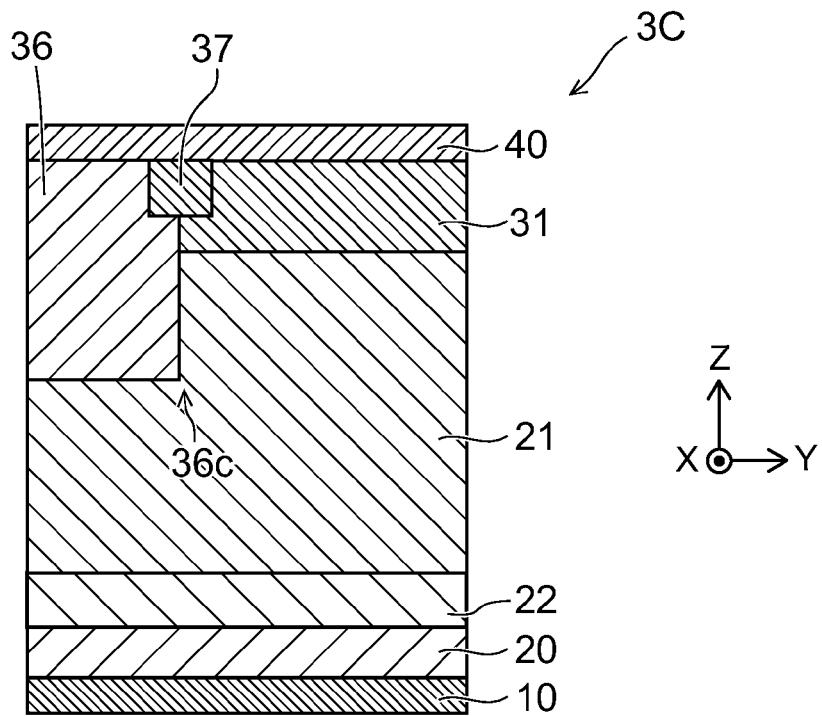
FIGS. 15A and 15B are schematic sectional views of semiconductor devices according to variations of the third embodiment.
Figure 15B:
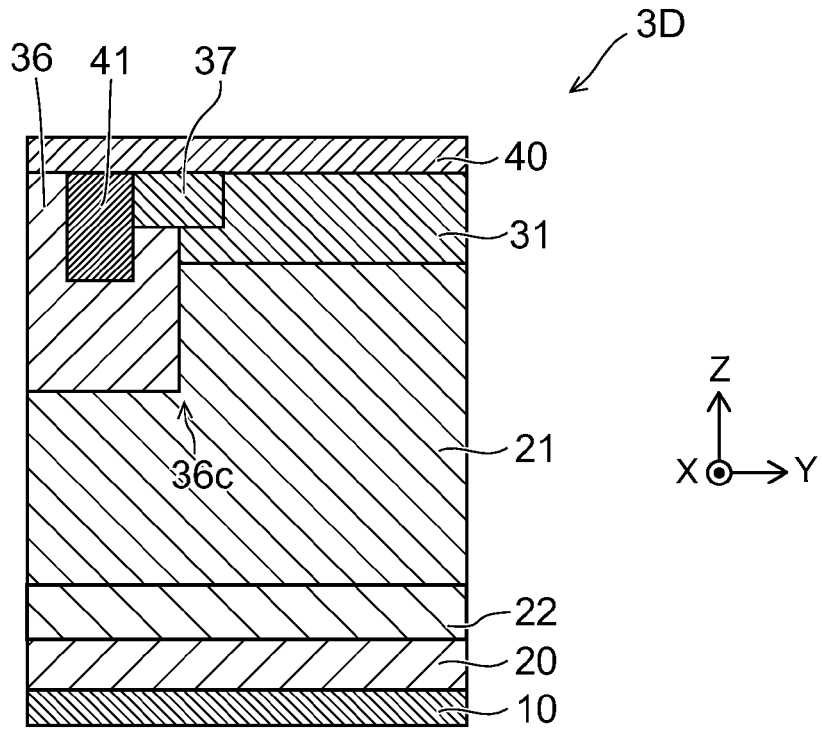

FIGS. 15A and 15B are schematic sectional views of semiconductor devices according to variations of the third embodiment. FIG. 15A is a schematic sectional view of a semiconductor device according to a second variation. FIG. 15B is a schematic sectional view of a semiconductor device according to a third variation.

As shown in FIG. 15A, in the semiconductor device 3C, the p$^+$-type anode region 37 is provided on part of the p$^-$-type anode region 36, and further provided on part of the p$^-$-type anode region 31. That is, the p$^+$-type anode region 37 is provided astride the p$^-$-type anode region 36 and the p$^-$-type anode region 31.

In such a structure, the p$^+$-type anode region 37 is located above the curved portion 36c. Thus, the avalanche current is ejected more efficiently through the p$^+$-type anode region 37 to the anode electrode 40 side.

As shown in FIG. 15B, the semiconductor device 3D further includes an interconnect layer 41 in contact with the p$^+$-type anode region 37, the anode electrode 40, and the p$^-$-type anode region 36.

In such a structure, the p$^+$-type anode region 37 is located above the curved portion 36c. Thus, the avalanche current is ejected more efficiently through the p$^+$-type anode region 37 and the interconnect layer 41 to the anode electrode 40 side.

Fourth Embodiment

Figure 16A:
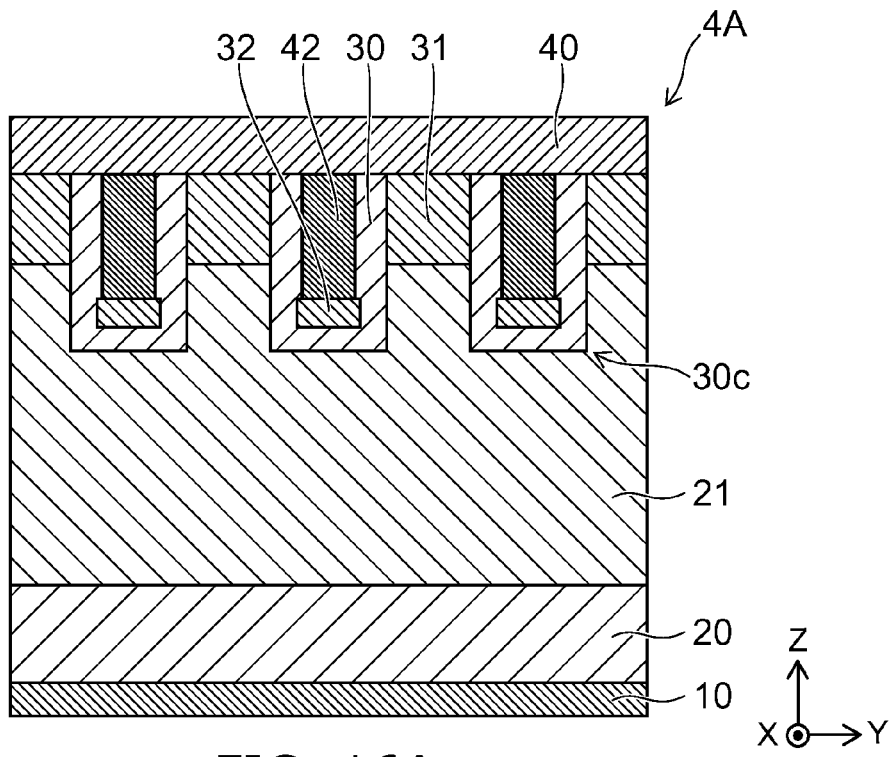
FIG. 16A is a schematic sectional view of a semiconductor device according to a first example of a fourth embodiment.
Figure 16B:
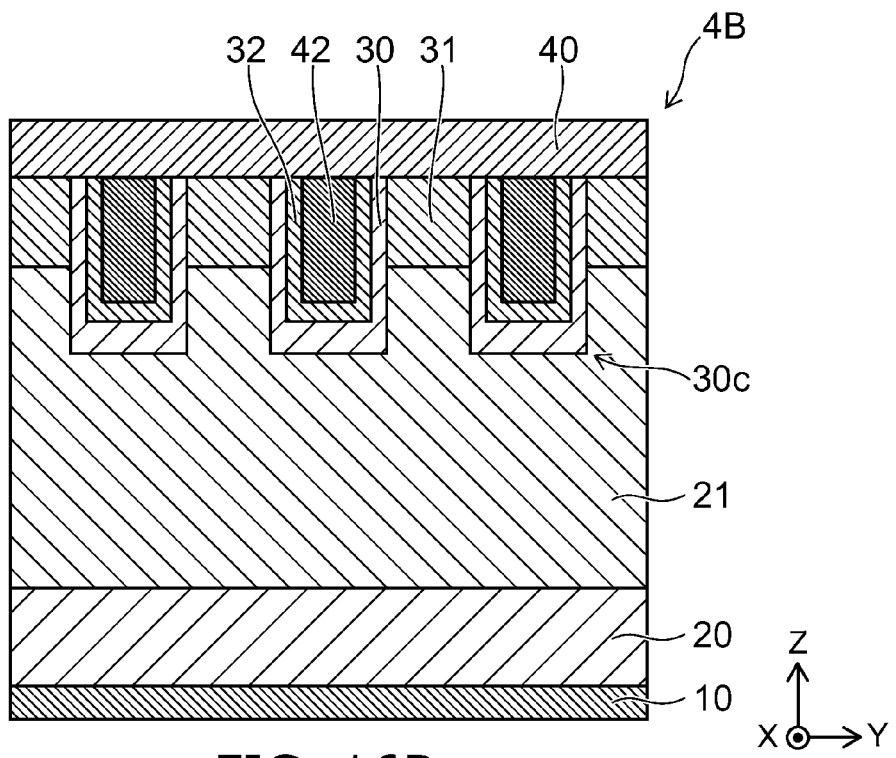
FIG. 16B is a schematic sectional view of a semiconductor device according to a second example of the fourth embodiment.

FIG. 16A is a schematic sectional view of a semiconductor device according to a first example of a fourth embodiment. FIG. 16B is a schematic sectional view of a semiconductor device according to a second example of the fourth embodiment.

In the semiconductor device 4A according to the first example of the fourth embodiment, as shown in FIG. 16A, the p$^+$-type anode region 32 and the anode electrode 40 are connected by a connecting region 42. The material of the connecting region 42 may be identical to or different from the material of the anode electrode 40. In the case where the material of the connecting region 42 is identical to the material of the anode electrode 40, the connecting region 42 may be part of the anode electrode 40. In this case, the connecting region 42 is an extending portion extending from the anode electrode 40.

In the semiconductor device 4B according to the second example, as shown in FIG. 16B, the portion of the connecting region 42 other than the portion connected to the anode electrode 40 is surrounded with the p$^+$-type anode region 32.

In the semiconductor device 4A, 4B, the distance between the connecting region 42 and the cathode electrode 10 is shorter than the distance between the p⁻-type anode region 31 and the cathode electrode 10.

By way of example, a method for manufacturing the semiconductor device 4A is now described.

Figure 17A:
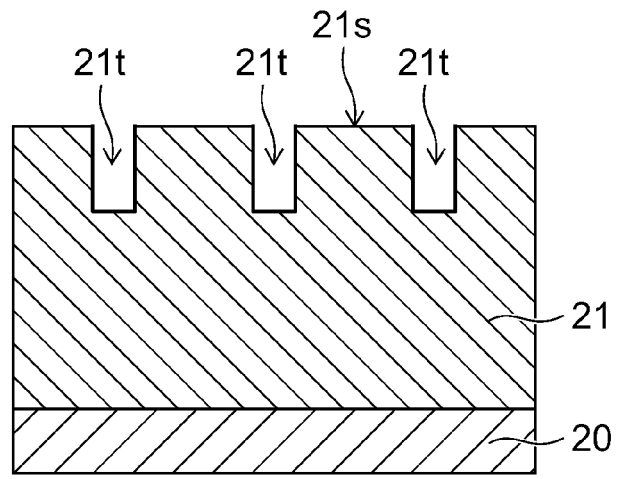
FIGS. 17A to 17C are schematic sectional views showing a process for manufacturing the semiconductor device according to the first example of the fourth embodiment.
Figure 17B:
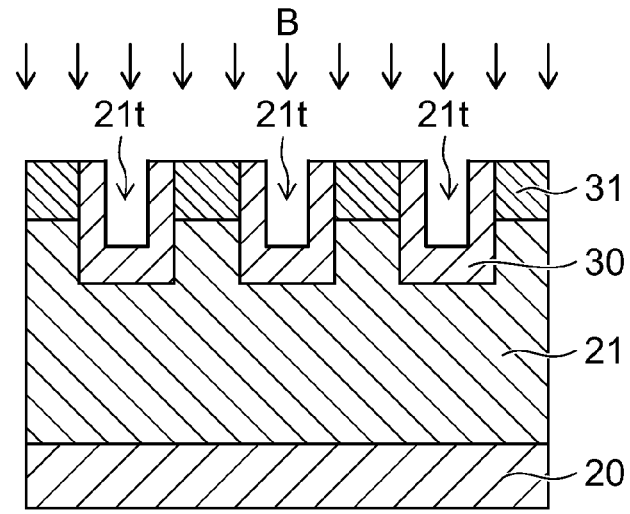
Figure 17C:
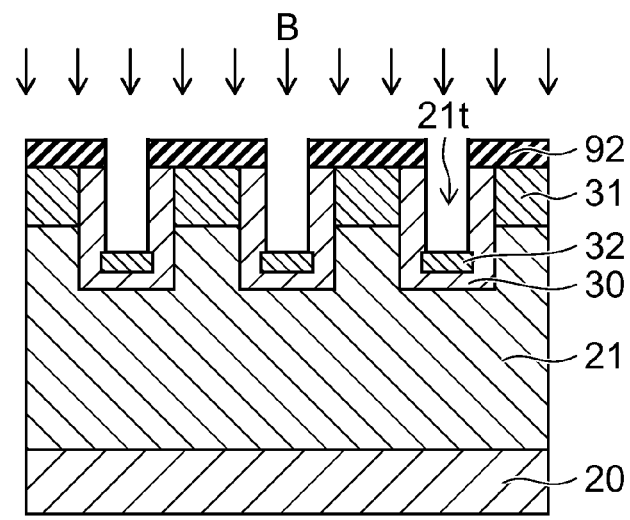

FIGS. 17A to 17C are schematic sectional views showing a process for manufacturing the semiconductor device according to the first example of the fourth embodiment.

First, as shown in FIG. 17A, a trench 21t is formed in the n⁻-type base layer 21 by photolithography and RIE. Next, as shown in FIG. 17B, from the upper surface side of the n⁻-type base layer 21, a p-type impurity element (e.g., boron) is ion implanted. On the upper surface side of the n⁻-type base layer 21, for instance, the impurity element is implanted in a larger total amount of impurity than the total amount of impurity contained in the n⁻-type base layer 21.

For instance, the impurity element is implanted from the upper surface 21s of the n⁻-type base layer 21 into the n⁻-type base layer 21. In addition, the impurity element is implanted through the inside of the trench 21t into the n⁻-type base layer 21. Then, heat treatment is performed as necessary on the n⁻-type base layer 21.

Thus, on the n⁻-type base layer 21, a p⁻-type anode region 30 and a p⁻-type anode region 31 are formed. The low concentration p-type anode region including the p⁻-type anode region 30 and the p⁻-type anode region 31 is formed along the upper surface 21s of the n⁻-type base layer 21 and the inner wall of the trench 21t.

The p⁻-type anode region 30 and the p⁻-type anode region 31 are simultaneously formed. Thus, for instance, the total amount of impurity contained in the p⁻-type anode region 30 is equal to the total amount of impurity contained in the p⁻-type anode region 31. However, these total amounts of impurity may be different. Examples in this case of being different are also encompassed within the scope of this embodiment.

Next, as shown in FIG. 17C, a mask 92 opening the trench 21t is formed on the low concentration p-type anode region. This mask 92 may be based on an oxide film or the like formed on the n⁻-type base layer 21. Subsequently, from the upper surface side of the low concentration p-type anode region, a p-type impurity element (e.g., boron) is further ion implanted. The impurity element is blocked by the mask 92, and selectively implanted from the bottom of the trench 21t into the p⁻-type anode region 30. Then, heat treatment is performed as necessary.

Thus, a p⁺-type anode region 32 is formed below the bottom of the trench 21t. Then, as shown in FIG. 16A, a connecting region 42 is formed in the trench 21t, and an anode electrode 40 is formed on the p⁻-type anode region 30, 31.

In the fourth embodiment, a p-type impurity element is implanted through the trench 21t into the n⁻-type base layer 21. Thus, a deep p⁻-type anode region 30 is formed even if the diffusion distance of the impurity element is shorter than the diffusion distance in the n⁻-type base layer 21 shown in FIGS. 2A and 2B. That is, the distance from the junction between the p⁻-type anode region 30 and the n⁻-type base layer 21 to the cathode electrode 10 is made shorter than the distance from the junction between the p⁻-type anode region 31 and the n⁻-type base layer 21 to the cathode electrode 10. In other words, according to the fourth embodiment, the p⁻-type anode region 30 can be formed by a diffusion process with lower temperature and shorter diffusion time than according to the first embodiment.

Furthermore, in the fourth embodiment, the p⁺-type anode region 32 is closer to the curved portion 30c than in the first embodiment. Thus, the avalanche current generated by the curved portion 30c is ejected more reliably to the anode electrode 40 by the p⁺-type anode region 32. This further increases the breakdown withstand capability of the semiconductor device at turn-off time.

Fifth Embodiment

Figure 18A:
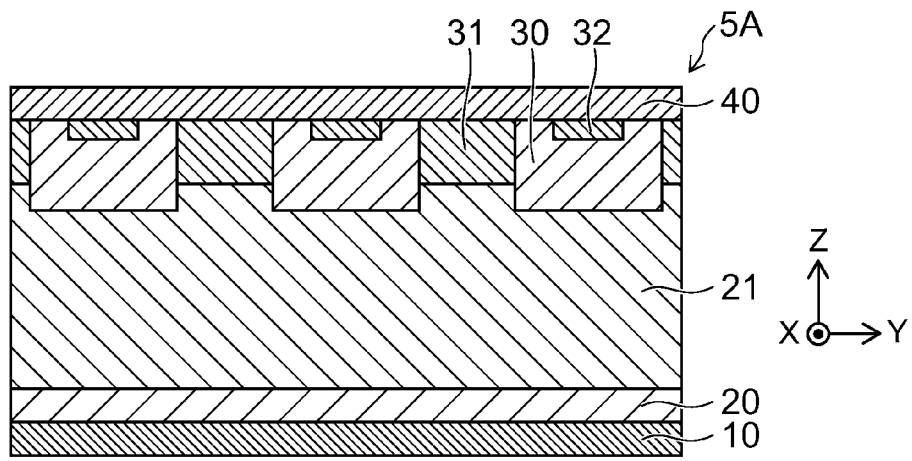
FIG. 18A is a schematic sectional view of a semiconductor device according to a first example of a fifth embodiment.
Figure 18B:
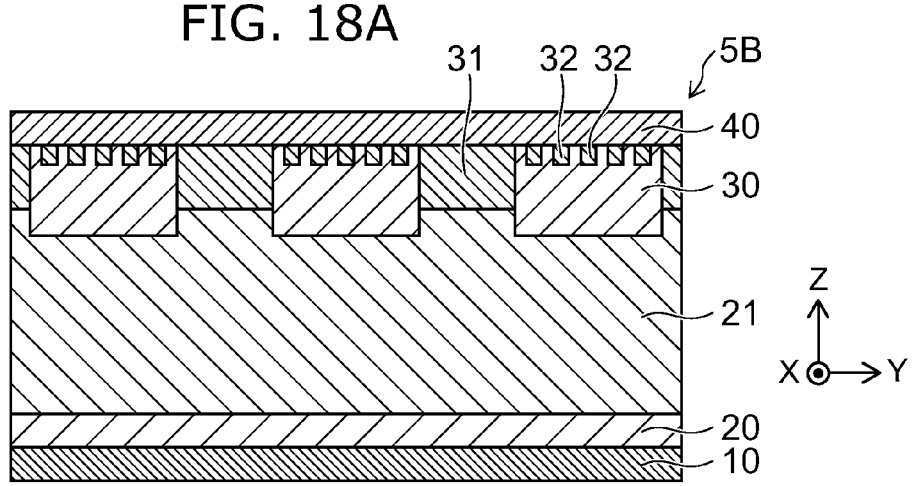
FIG. 18B is a schematic sectional view of a semiconductor device according to a second example of the fifth embodiment.
Figure 18C:
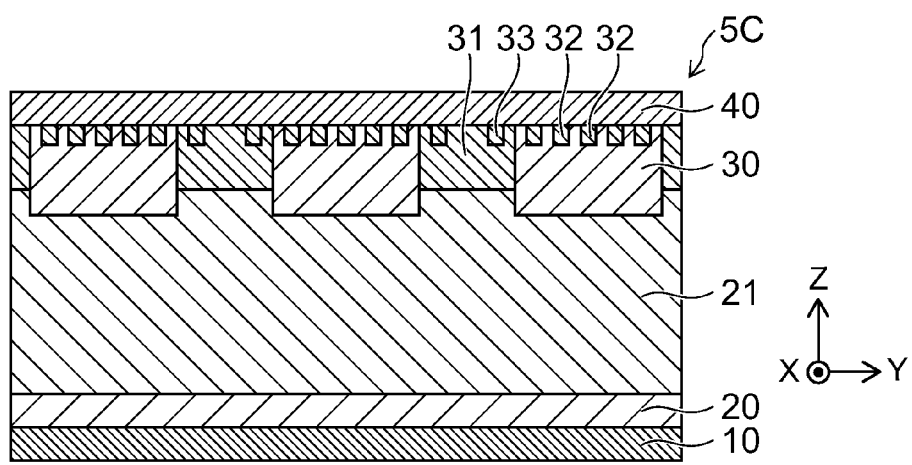
FIG. 18C is a schematic sectional view of a semiconductor device according to a third example of the fifth embodiment.

FIG. 18A is a schematic sectional view of a semiconductor device according to a first example of a fifth embodiment. FIG. 18B is a schematic sectional view of a semiconductor device according to a second example of the fifth embodiment. FIG. 18C is a schematic sectional view of a semiconductor device according to a third example of the fifth embodiment.

FIG. 3 described above shows a structure in which two p⁺-type anode regions 32 are provided in one p⁻-type anode region 30. However, the number of p⁺-type anode regions 32 provided in one p⁻-type anode region 30 is not limited to two.

For instance, as shown in FIG. 18A, one p⁺-type anode region 32 may be provided in one p⁻-type anode region 30. Alternatively, as shown in FIG. 18B, three or more p⁺-type anode regions 32 may be provided in one p⁻-type anode region 30.

Here, for instance, consider the case where the contact area (or occupancy ratio) between one p⁺-type anode region 32 and the anode electrode 40 in the semiconductor device 5A is equal to the contact area between two p⁺-type anode regions 32 and the anode electrode 40 in the semiconductor device 1A. Furthermore, consider the case where the contact area (occupancy ratio) between three or more p⁺-type anode regions 32 and the anode electrode 40 in the semiconductor device 5B is equal to the contact area between two p⁺-type anode regions 32 and the anode electrode 40 in the semiconductor device 1A.

In the semiconductor devices 5A, 5B, in the on-state, hole injection from the anode side is suppressed. Furthermore, at turn-off time, holes reliably flow out to the anode electrode 40 through the p⁺-type anode region 32. Thus, in the semiconductor devices 5A, 5B, the breakdown withstand capability at turn-off time is increased.

Furthermore, in the semiconductor device 5B shown in FIG. 18B, three or more p⁺-type anode regions 32 are dispersed in one p⁻-type anode region 30. According to simulation, it has been found that hole injection from the anode side in the on-state is further suppressed by narrowing the width itself of the p⁺-type anode region 32. Thus, in the semiconductor device 5B, hole injection from the anode side in the on-state is further suppressed than in the semiconductor device 1A, although the contact area between the p⁺-type anode region 32 and the anode electrode 40 is equal. Accordingly, the semiconductor device 5B enables faster switching operation than the semiconductor device 1A.

Furthermore, the high concentration p⁺-type anode region may be provided outside the p⁻-type anode region 30. For instance, as shown in FIG. 18C, the p⁺-type anode region 33 may be provided in the p⁻-type anode region 31. Thus, at turn-off time, holes flow out to the anode electrode 40 through the p⁺-type anode region 33 in addition to the p⁺-type anode region 32. As a result, the breakdown withstand capability at turn-off time is further increased. Furthermore, in order to suppress hole injection from the anode side in the on-state, the total amount of impurity of the p⁻-type anode region 31 may be made comparable to the total amount of impurity of the p⁻-type anode region 30. For instance, the total amount of impurity contained in the p⁻-type anode region 30 at the surface in contact with the anode electrode 40 in the p⁻-type anode region 30 may be made equal to the total amount of impurity contained in the p⁻-type anode region 31 at the surface in contact with the anode electrode 40 in the p⁻-type anode region 31.

Sixth Embodiment

Figure 19:
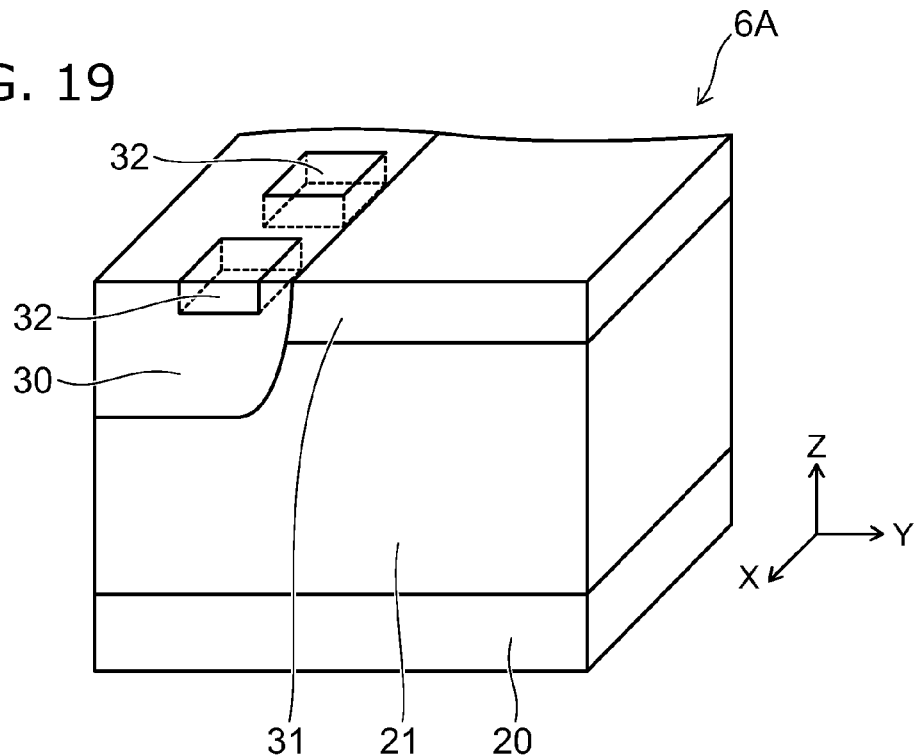
FIG. 19 is a schematic perspective view of a semiconductor device according to a first example of a sixth embodiment.

FIG. 19 is a schematic perspective view of a semiconductor device according to a first example of a sixth embodiment.

In FIGS. 3 and 18B, a plurality of p⁺-type anode regions 32 are arranged in the Y direction in the p⁻-type anode region 30. However, the arranging direction of the plurality of p⁺-type anode regions 32 is not limited to the Y direction.

For instance, as in the semiconductor device 6A shown in FIG. 19, while the p⁻-type anode regions 30 are dispersed in the Y direction, the plurality of p⁺-type anode regions 32 may be dispersed in the X direction. That is, in the semiconductor device 6A, the plurality of p⁺-type anode regions 32 are dispersed in the X direction in which the p⁻-type anode region 30 extends. Thus, compared with the structure in which a continuous p⁺-type anode region 32 is brought into contact with the anode electrode 40, the contact area (or occupancy ratio) between the p⁺-type anode region 32 and the anode electrode 40 is decreased. This further suppresses hole injection from the anode side in the on-state. As a result, faster switching operation can be performed.

Figure 20:
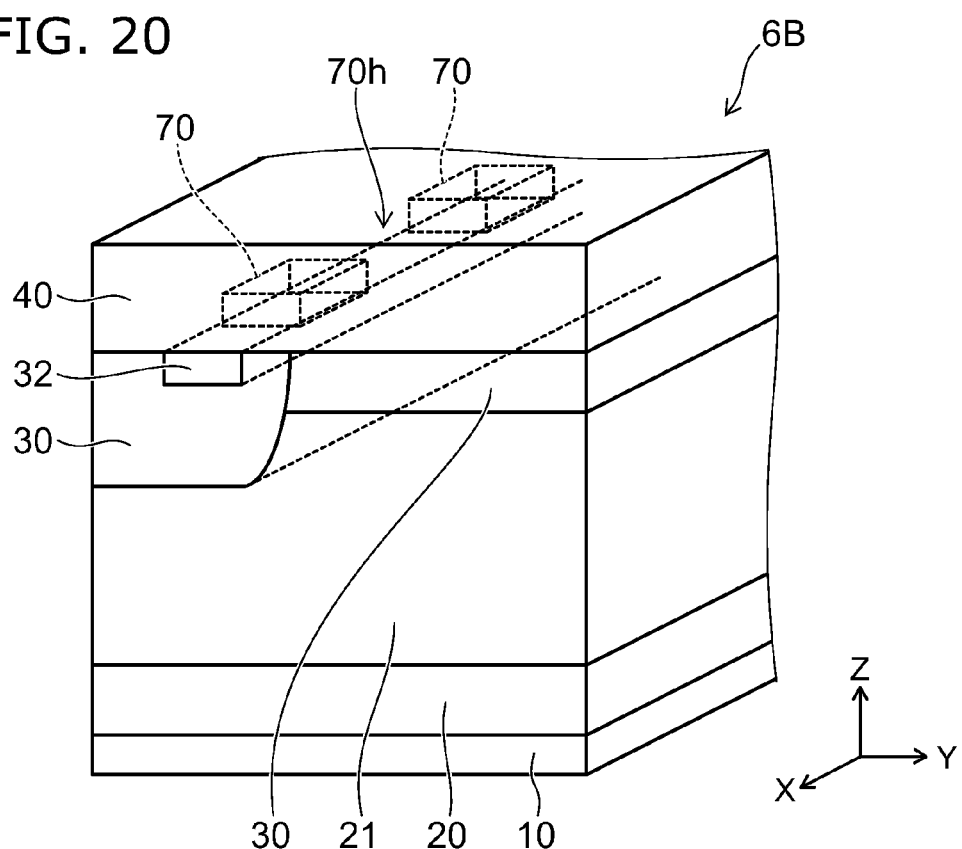
FIG. 20 is a schematic perspective view of a semiconductor device according to a second example of the sixth embodiment.

FIG. 20 is a schematic perspective view of a semiconductor device according to a second example of the sixth embodiment.

In FIG. 19, the p⁺-type anode regions 32 are separated and dispersed in the X direction. Alternatively, as in the semiconductor device 6B shown in FIG. 20, an insulating layer 70 may be selectively provided between the p⁺-type anode region 32 extending in the X direction and the anode electrode 40.

In this case, the gap between the adjacent insulating layers 70 constitutes an opening 70h of the insulating layer. Through this opening 70h, the p⁺-type anode region 32 and the anode electrode 40 are made electrically continuous. Such a structure also suppresses hole injection from the anode side in the on-state and enables faster switching operation. Furthermore, in the semiconductor device 6B, at turn-off time, the low concentration anode region (p⁻-type anode region 30) located below the insulating layer 70 serves as what is called a ballast resistor. Thus, local concentration of the avalanche current is further dispersed. As a result, the breakdown withstand capability of the semiconductor device at turn-off time is further increased.

Seventh Embodiment

Figure 21A:
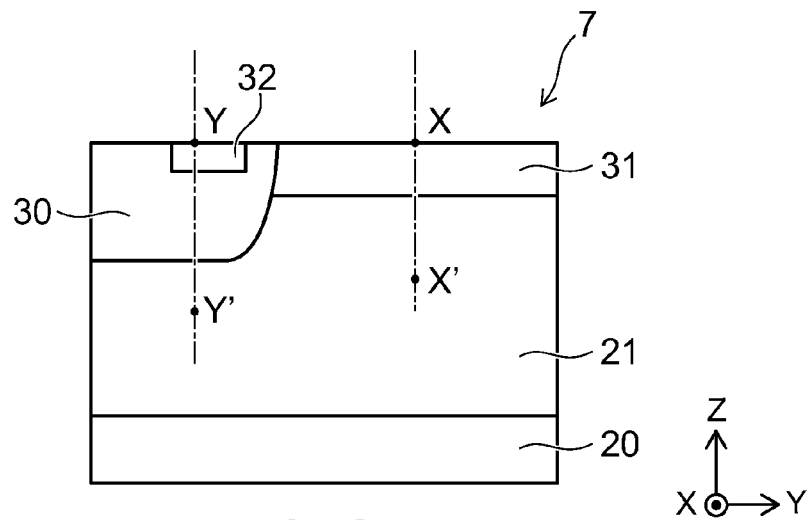
FIG. 21A is a schematic sectional view of a semiconductor device.
Figure 21B:
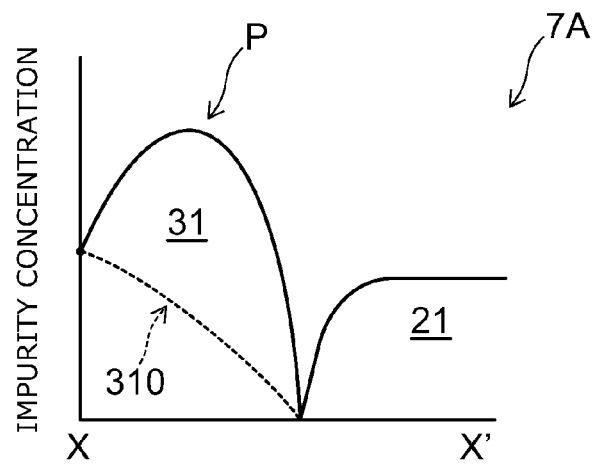
FIG. 21B is a graph showing the impurity concentration profile of a semiconductor device according to a first example of a seventh embodiment.
Figure 21C:
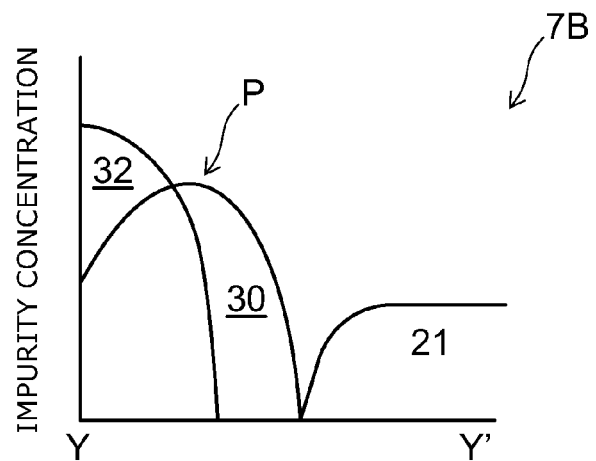
FIG. 21C is a graph showing the impurity concentration profile of a semiconductor device according to a second example of the seventh embodiment.

FIG. 21A is a schematic sectional view of a semiconductor device. FIG. 21B is a graph showing the impurity concentration profile of a semiconductor device according to a first example of a seventh embodiment. FIG. 21C is a graph showing the impurity concentration profile of a semiconductor device according to a second example of the seventh embodiment.

FIG. 21B is a graph showing the impurity concentration profile at the position of X-X' cross section in FIG. 21A. FIG. 21C is a graph showing the impurity concentration profile at the position of Y-Y' cross section in FIG. 21A.

In the embodiment, in order to suppress hole injection from the anode side at on-time, the total amount of impurity contained in the p⁻-type anode region 30 is made lower than the total amount of impurity contained in the p⁺-type anode region 32.

On the other hand, in the impurity concentration profile 310 according to a reference example, the impurity concentration in the p⁻-type anode region 30 gradually decreases from the anode side toward the cathode side. Then, the depletion layer generated at turn-off time may excessively extend and reach the anode electrode 40. In this case, what is called the punch-through may occur and degrade the breakdown voltage of the semiconductor device.

In contrast, in the semiconductor device 7A shown in FIG. 21B, the impurity concentration in the p⁻-type anode region 31 once increases, and then gradually decreases, from the anode side toward the cathode side. That is, the impurity concentration in the p⁻-type anode region 31 has a peak value p in the p⁻-type anode region 31. In other words, the peak of the impurity concentration is positioned between the anode electrode 40 and the n⁻-type base layer 21, and the impurity concentration at the peak is higher than the impurity concentration at a junction between the anode electrode 40 and the p⁻-type anode region 31.

Such a structure suppresses the extension of the depletion layer generated at turn-off time while maintaining Schottky contact with the anode electrode 40. Thus, what is called the punch-through is less likely to occur. As a result, the breakdown voltage of the semiconductor device is maintained.

Furthermore, also in the semiconductor device 7B shown in FIG. 21C, the impurity concentration in the p⁻-type anode region 30 once increases, and then gradually decreases, from the anode side toward the cathode side. That is, the impurity concentration in the p⁻-type anode region 30 has a peak value p in the p⁻-type anode region 30. The position of the peak value p may be located at a position deeper than the p⁺-type anode region 32, or may be located in the p⁺-type anode region 32.

Such a structure suppresses the extension of the depletion layer generated at turn-off time. Thus, what is called the punch-through is less likely to occur. That is, the depletion layer generated at turn-off time is less likely to reach the p⁺-type anode region 32. As a result, the breakdown voltage of the semiconductor device is maintained.

Eighth Embodiment

Figure 22:
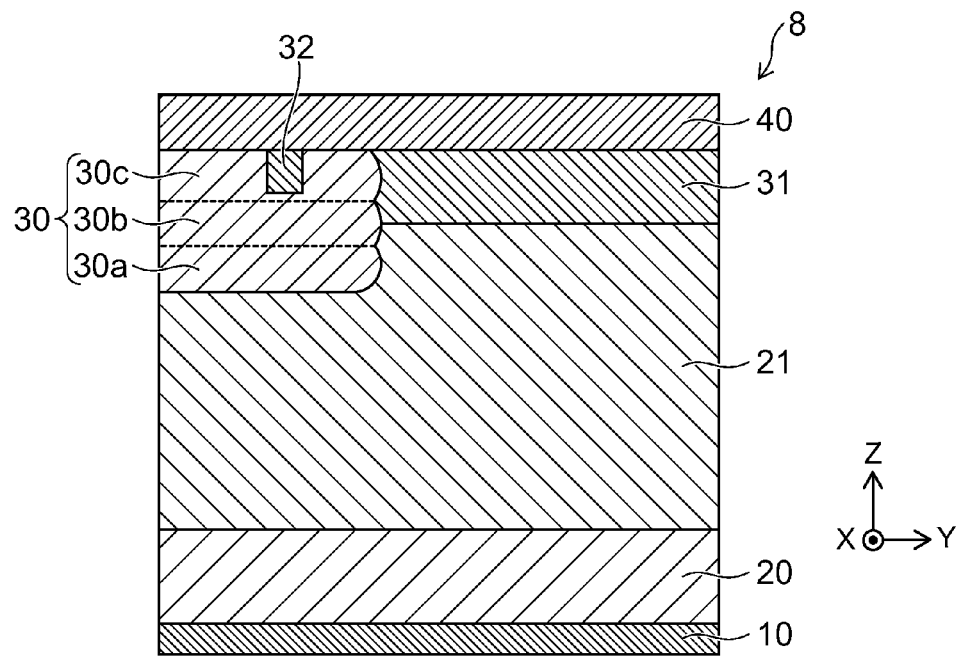
FIG. 22 is a schematic sectional view of a semiconductor device according to an eighth embodiment.

FIG. 22 is a schematic sectional view of a semiconductor device according to an eighth embodiment.

In the semiconductor device 8 according to the eighth embodiment, in the case where the p⁻-type anode region 30 is formed by ion implantation, the p⁻-type anode region 30 is formed with the acceleration of the impurity element varied.

For instance, a p⁻-type anode region portion 30a is formed at a first energy. A p⁻-type anode region portion 30b is formed on the p⁻-type anode region portion 30a at a second energy. Then, a p⁻-type anode region portion 30c is formed on the p⁻-type anode region portion 30b at a third energy.

In this case, the first energy is the highest, and the third energy is the lowest. In such a structure, a deeper p⁻-type anode region 30 can be easily formed. Also in such a structure, the avalanche current is reliably ejected to the anode electrode 40 by the p⁺-type anode region 32. As a result, the breakdown withstand capability of the semiconductor device at turn-off time is further increased.

Ninth Embodiment

Figure 23:
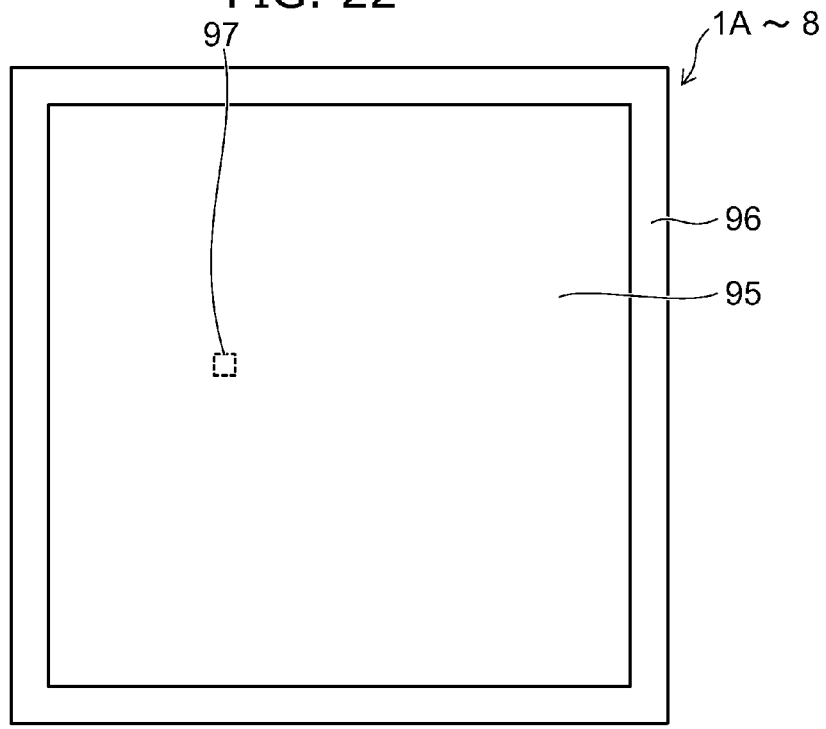
FIG. 23 is a schematic plan view of a semiconductor device according to a ninth embodiment.

FIG. 23 is a schematic plan view of a semiconductor device according to a ninth embodiment.

FIG. 23 shows a schematic plan view of the semiconductor devices 1A, 1B, 1C, 1D, 2A, 2B, 2C, 2D, 3A, 3B, 3C, 3D, 4A, 4B, 5A, 5B, 6A, 6B, 7A, 7B, 8. Each of the semiconductor devices 1A-8 includes an active region 95 and a peripheral region 96 surrounding the active region 95. Here, the active region 95 is a region in which the semiconductor device can function as an element (diode).

For instance, the occupancy ratio of each of the $p^+$-type anode regions 32, 33, 34, 37, 35 in an arbitrary region 97 in the active region 95 is 20% or less, and preferably 10% or less. Here, the arbitrary region 97 refers to a region of e.g. 100 μm square randomly selected from inside the active region 95. In the region 97, the semiconductor device can function as a diode illustrated in this embodiment.

Such a dimension or occupancy ratio of the $p^+$-type anode region enables fast switching and high breakdown withstand capability at turn-off time of the semiconductor devices 1A-8.

Furthermore, in the first to ninth embodiments described above, the width in the Y direction of each of the $p^+$-type anode regions 32, 33, 34, 37, 35 in the $p^-$-type anode region is e.g. 10 μm or less. The film thickness of each of the $p^+$-type anode regions 32, 33, 34, 37, 35 in the $p^-$-type anode region is 5 μm or less.

The pitch in the Y direction of the $p^+$-type anode regions 32, 33, 34, 37, 35 in the $p^-$-type anode region is 100 μm or less. However, in FIGS. 18B and 18C, the sets of a plurality of $p^+$-type anode regions 32 in the $p^-$-type anode region are arranged at a pitch of 100 μm or less in the Y direction.

The occupancy ratio of each of the $p^+$-type anode regions 32, 33, 34, 37, 35 in an arbitrary region in the active region of the semiconductor device is 20% or less, and preferably 10% or less.

In the present embodiments, the semiconductor is composed primarily of e.g. silicon (Si). However, the present embodiments are also applicable to semiconductor devices including compound materials such as silicon carbide (SiC) and gallium nitride (GaN). Furthermore, obviously, similar effects are achieved even if the conductivity types of the p-type semiconductor layers and the n-type semiconductor layers of the present embodiments are interchanged.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device comprising:
a first electrode;
a second electrode;
a first semiconductor layer of a first conductivity type provided between the first electrode and the second electrode;
a second semiconductor layer of the first conductivity type provided between the first semiconductor layer and the second electrode, and the second semiconductor layer having a lower impurity concentration than the first semiconductor layer;
a first semiconductor region of a second conductivity type provided between part of the second semiconductor layer and the second electrode;
a second semiconductor region of the second conductivity type provided between a portion different from the part of the second semiconductor layer and the second electrode, and the second semiconductor region being in contact with the first semiconductor region; and
a third semiconductor region of the second conductivity type provided between at least part of the first semiconductor region and the second electrode,
impurity concentration of the third semiconductor region at a surface in contact with the second electrode in the third semiconductor region being higher than impurity concentration of the first semiconductor region at a surface in contact with the second electrode in the first semiconductor region and impurity concentration of the second semiconductor region at a surface in contact with the second electrode in the second semiconductor region, and
thickness of the second semiconductor layer sandwiched between the first semiconductor region and the first semiconductor layer being thinner than thickness of the second semiconductor layer sandwiched between the second semiconductor region and the first semiconductor layer.

2. The device according to claim 1, wherein the first semiconductor region includes a curved portion, and a junction portion between the first semiconductor region and the second semiconductor layer is curved in the curved portion.

3. The device according to claim 1, wherein an impurity concentration in the second semiconductor region has a peak value in the second semiconductor region, the peak of the impurity concentration is positioned between the second electrode and the second semiconductor layer, and the impurity concentration at the peak is higher than the impurity concentration at a junction between the second electrode and the second semiconductor region.

4. The device according to claim 2, wherein the third semiconductor region is located at least near directly above the curved portion, where the first electrode side is defined as lower side, and the second electrode side is defined as upper side.

5. The device according to claim 1, wherein the first semiconductor region and the second semiconductor region are in Schottky contact with the second electrode.

6. The device according to claim 1, wherein a material of the second electrode are a metal containing at least one selected from the group consisting of platinum (Pt), titanium (Ti), nickel (Ni), tungsten (W), gold (Au).

7. The device according to claim 1, wherein the third semiconductor region is in ohmic contact with the second electrode.

8. The device according to claim 1, wherein the third semiconductor region is provided between the at least part of the first semiconductor region and the second electrode, and further provided between part of the second semiconductor region and the second electrode.

9. The device according to claim 1, further comprising:
a connecting region between the third semiconductor region and the second electrode.

10. The device according to claim 9, wherein distance between the connecting region and the first electrode is shorter than distance between the second semiconductor region and the first electrode.

11. A semiconductor device comprising:
a first electrode;
a second electrode;
a first semiconductor layer of a first conductivity type provided between the first electrode and the second electrode;
a second semiconductor layer of the first conductivity type provided between the first semiconductor layer and the second electrode, and the second semiconductor layer having a lower impurity concentration than the first semiconductor layer;
a first semiconductor region of a second conductivity type provided between part of the second semiconductor layer and the second electrode; and
a third semiconductor region of the second conductivity type provided between part of the first semiconductor region and the second electrode,
impurity concentration of the third semiconductor region at a surface in contact with the second electrode in the third semiconductor region being higher than impurity concentration of the first semiconductor region at a surface in contact with the second electrode in the first semiconductor region, and
thickness of the second semiconductor layer sandwiched between the first semiconductor region and the first semiconductor layer being thinner than thickness of the second semiconductor layer in a portion not provided with the first semiconductor region.

12. The device according to claim 11, wherein the first semiconductor region includes a curved portion, and a junction between the first semiconductor region and the second semiconductor layer is curved in the curved portion.

13. The device according to claim 11, wherein the third semiconductor region is located at least near directly above the curved portion, where the first electrode side is defined as lower side, and the second electrode side is defined as upper side.

14. The device according to claim 11, wherein the first semiconductor region is in Schottky contact with the second electrode.

15. The device according to claim 11, wherein a material of the second electrode are a metal containing at least one selected from the group consisting of platinum (Pt), titanium (Ti), nickel (Ni), tungsten (W), gold (Au).

16. The device according to claim 11, wherein the third semiconductor region is in ohmic contact with the second electrode.

17. The device according to claim 11, further comprising:
an insulating layer between the second semiconductor layer in the portion not provided with the first semiconductor region and the second electrode.

18. The device according to claim 11, wherein the third semiconductor region is provided between the part of the first semiconductor region and the second electrode, and further the third semiconductor region is provided between the second semiconductor layer in the portion not provided with the first semiconductor region and the second electrode.

19. A semiconductor device comprising:
a first electrode;
a second electrode;
a first semiconductor layer of a first conductivity type provided between the first electrode and the second electrode;
a second semiconductor layer of the first conductivity type provided between the first semiconductor layer and the second electrode, and the second semiconductor layer having a lower impurity concentration than the first semiconductor layer;
a second semiconductor region of a second conductivity type provided between part of the second semiconductor layer and the second electrode; and
a third semiconductor region of the second conductivity type provided between a portion different from the part of the second semiconductor layer and the second electrode, and the third semiconductor region being in contact with the second semiconductor region,
impurity concentration of the third semiconductor region at a surface in contact with the second electrode in the third semiconductor region being higher than impurity concentration of the second semiconductor region at a surface in contact with the second electrode in the second semiconductor region,
thickness of the second semiconductor layer sandwiched between the third semiconductor region and the first semiconductor layer being thinner than thickness of the second semiconductor layer sandwiched between the second semiconductor region and the first semiconductor layer, and
width of the third semiconductor region being narrower than width of the second semiconductor region in a first direction, and the second semiconductor region and the third semiconductor region are arranged in the first direction.

20. The device according to claim 19, wherein the third semiconductor region includes a curved portion, and a junction between the third semiconductor region and the second semiconductor layer is curved in the curved portion.

* * * * *